United States Patent
Cheng et al.

(10) Patent No.: US 9,524,898 B2
(45) Date of Patent: Dec. 20, 2016

(54) MONOLITHIC INTEGRATION TECHNIQUES FOR FABRICATING PHOTODETECTORS WITH TRANSISTORS ON SAME SUBSTRATE

(71) Applicant: Artilux, Inc., Zhubei (TW)

(72) Inventors: Szu-Lin Cheng, Zhubei (TW); Shu-Lu Chen, Zhubei (TW)

(73) Assignee: ARTILUX, INC., Zhubei (TW)

( * ) Notice: Subject to any disclaimer, the term of this patent is extended or adjusted under 35 U.S.C. 154(b) by 0 days.

(21) Appl. No.: 14/950,494

(22) Filed: Nov. 24, 2015

(65) Prior Publication Data

US 2016/0155763 A1 Jun. 2, 2016

Related U.S. Application Data

(60) Provisional application No. 62/083,321, filed on Nov. 24, 2014, provisional application No. 62/112,615, (Continued)

(51) Int. Cl.
*H01L 21/77* (2006.01)
*H01L 21/70* (2006.01)
(Continued)

(52) U.S. Cl.
CPC .............. *H01L 21/70* (2013.01); *H01L 21/77* (2013.01); *H01L 21/823475* (2013.01);
(Continued)

(58) Field of Classification Search
CPC .. H01L 21/70; H01L 21/77; H01L 21/823475; H01L 29/78; H01L 31/105; H01L 31/18
See application file for complete search history.

(56) References Cited

U.S. PATENT DOCUMENTS

| 8,257,997 B2 | 9/2012 | Chen et al. |
| 2006/0110844 A1 | 5/2006 | Lee et al. |

(Continued)

FOREIGN PATENT DOCUMENTS

| JP | 01239967 A | 9/1989 |
| JP | 2008140808 A | 6/2008 |

(Continued)

OTHER PUBLICATIONS

International Search Report and Written Opinion mailed Mar. 8, 2016, for International Patent Application No. PCT/US2015/062198 filed Nov. 23, 2015, pp. 1-14.

(Continued)

*Primary Examiner* — Fei Fei Yeung Lopez
(74) *Attorney, Agent, or Firm* — Perkins Coie LLP

(57) ABSTRACT

Examples of the various techniques introduced here include, but not limited to, a mesa height adjustment approach during shallow trench isolation formation, a transistor via first approach, and a multiple absorption layer approach. As described further below, the techniques introduced herein include a variety of aspects that can individually and/or collectively resolve or mitigate one or more traditional limitations involved with manufacturing PDs and transistors on the same substrate, such as above discussed reliability, performance, and process temperature issues.

15 Claims, 32 Drawing Sheets

Related U.S. Application Data filed on Feb. 5, 2015, provisional application No. 62/193,129, filed on Jul. 16, 2015, provisional application No. 62/197,098, filed on Jul. 26, 2015.

(51) Int. Cl.

| | | |
|---|---|---|
| *H01L 27/144* | (2006.01) | |
| *H01L 31/18* | (2006.01) | |
| *H01L 21/8234* | (2006.01) | |
| *H01L 31/0216* | (2014.01) | |
| *H01L 29/78* | (2006.01) | |
| *H01L 31/105* | (2006.01) | |
| *H01L 31/028* | (2006.01) | |
| *H01L 31/02* | (2006.01) | |
| *H01L 31/0232* | (2014.01) | |

(52) U.S. Cl.
CPC .......... *H01L 27/1443* (2013.01); *H01L 29/78* (2013.01); *H01L 31/02005* (2013.01); *H01L 31/028* (2013.01); *H01L 31/02161* (2013.01); *H01L 31/02327* (2013.01); *H01L 31/105* (2013.01); *H01L 31/18* (2013.01); *H01L 31/1808* (2013.01); *H01L 31/1868* (2013.01)

(56) References Cited

U.S. PATENT DOCUMENTS

| | | |
|---|---|---|
| 2008/0303058 A1 | 12/2008 | Mori et al. |
| 2009/0101909 A1* | 4/2009 | Chen .................. H01L 31/1808 257/65 |
| 2010/0181601 A1 | 7/2010 | Tabatabaie et al. |
| 2012/0129302 A1 | 5/2012 | Assefa et al. |
| 2014/0353713 A1 | 12/2014 | Kuh et al. |

FOREIGN PATENT DOCUMENTS

| | | |
|---|---|---|
| JP | 2010212469 A | 9/2010 |
| JP | 2013201347 A | 10/2013 |
| WO | 9704493 A1 | 2/1997 |
| WO | 2009020433 A1 | 2/2009 |
| WO | 2010059419 A2 | 5/2010 |
| WO | 2011087633 A1 | 7/2011 |

OTHER PUBLICATIONS

U.S. Appl. No. 14/950,902 by Cheng, S., et al., filed Nov. 24, 2015.
Non Final Office Action mailed Aug. 31, 2016, for Patent Application No. 14/950,902 filed Nov. 24, 2015.

\* cited by examiner

Step 301

Step 302

Step 303

Step 304

Step 305

Step 306

Step 307

Step 308

Step 309

Step 310

Step 311

Step 312

Step 313

Step 314

Step 315

Step 316

Step 317

Step 318

Step 501

Step 502

Step 503

Step 504

Step 505

Step 506

Step 507

Step 508

Step 509

Step 510

Step 511

Step 512

Step 513

Step 514

Step 515

Step 516

Step 701

Step 702

Step 703

Step 704

Step 709

Step 710

Photodetector fill shape

Transistor fill shape

- Stopping layer/ Hardmask
- Passivation layer
- Substrate

Photodetector fill shape 810   Transistor fill shape 820

MONOLITHIC INTEGRATION TECHNIQUES FOR FABRICATING PHOTODETECTORS WITH TRANSISTORS ON SAME SUBSTRATE

PRIORITY CLAIM

This application claims priority to U.S. Provisional Patent Application No. 62/083,321, entitled "MONOLITHIC INTEGRATION OF SEMICONDUCTOR PHOTODETECTOR AND CMOS TRANSISTORS VIA STANDARD TRENCH ISOLATION PROCESS," filed on Nov. 24, 2014; U.S. Provisional Patent Application No. 62/112,615, entitled "MONOLITHIC INTEGRATION OF SEMICONDUCTOR PHOTODETECTORS AND CMOS TRANSISTORS USING TRANSISTOR VIA 1ST APPROACH," filed on Feb. 5, 2015; U.S. Provisional Patent Application No. 62/193,129, entitled "MONOLITHIC INTEGRATION PROCESS AND STRUCTURE," filed on Jul. 16, 2015; and U.S. Provisional Patent Application No. 62/197,098, entitled "MONOLITHIC INTEGRATION OF PHOTODETECTORS AND CMOS TRANSISTORS," filed on Jul. 26, 2015; all of which are incorporated by reference herein in their entireties.

TECHNICAL FIELD

Embodiments of the present disclosure relate to semiconductor device design, and more particularly, to monolithic integration of semiconductor photodetectors and transistors.

BACKGROUND

Fueled by big data, cloud computing, as well as other computer network and telecommunication applications, there is an ever increasing demand for high speed telecommunication means. High speed optical transmitters and receivers (or collectively referred to herein as "transceivers") that are capable of exceeding a transmission rate of 25 Gbps have attracted the public's attention.

While optical transceivers are gaining popularity, semiconductor photodetector (PD) manufacturing technology is often different and sometimes even incompatible with other kinds of semiconductor device manufacturing technologies, such as those for metal oxide semiconductor (MOS) transistors. Therefore, conventional PD devices are manufactured and packaged separately from other related integrated circuits (e.g., the transimpedance amplifier (TIA) chips). This separation unfortunately has become a bottleneck for high frequency communication. To overcome this limitation, it is preferable to manufacture the PD devices and the TIA on the same chip, which is known as "monolithic integration" of PD and TIA. However, a wide variety of issues come with such monolithic integration.

BRIEF DESCRIPTION OF THE DRAWINGS

One or more embodiments of the present disclosure are illustrated by way of example and not limitation in the figures of the accompanying drawings, in which like references indicate similar elements. These drawings are not necessarily drawn to scale.

DETAILED DESCRIPTION

It is observed that one primary cause for the aforementioned high frequency bottleneck for optical transceivers is the physical separation between the optical devices (e.g., photodetectors (PD) or sensors) and other circuits (e.g., transimpedance amplifiers (TIA), other amplifiers, or analog to digital convertors (ADC)). A typical optical device for receiving optical signal can be a P-I-N diode, including two highly-doped semiconductor layers with opposite electrical polarity (i.e., one "p-type" and one "n-type") and a photon absorption layer (i.e., "intrinsic") sandwiched in between the two layers. On the other hand, an amplifier typically includes a group of transistors (e.g., complementary metal oxide semiconductor (CMOS) or a combination of Bipolar and CMOS technology (BiCMOS)). In the context of P-I-N PDs, the term "highly-doped" typically may be understood as having a doping concentration above $10^{18}$ cm$^{-3}$; the term "intrinsic" typically may be understood as having a doping concentration below $10^{17}$ cm$^{-3}$.

As introduced above, to overcome this limitation, it is preferable to manufacture the PD devices and the transistors (e.g., TIA) on the same chip, which is known as "monolithic integration" of PD and transistors. However, a wide variety of issues come with such monolithic integration. Among others, one important issue for monolithic integration is the large step height difference between PD devices (which typically have heights ranging from 500 nm to 3 μm) and CMOS transistors (which typically have heights about 100 nm). With the natural step height difference between the two types of devices being this much, when standard middle-of-line (MOL) manufacturing processes for forming contact plugs are applied for both devices, the transistors' MOL contact plug height needs to be raised by a large amount in order to match the PDs' height. This is illustrated in FIG. 1.

Figure 1:
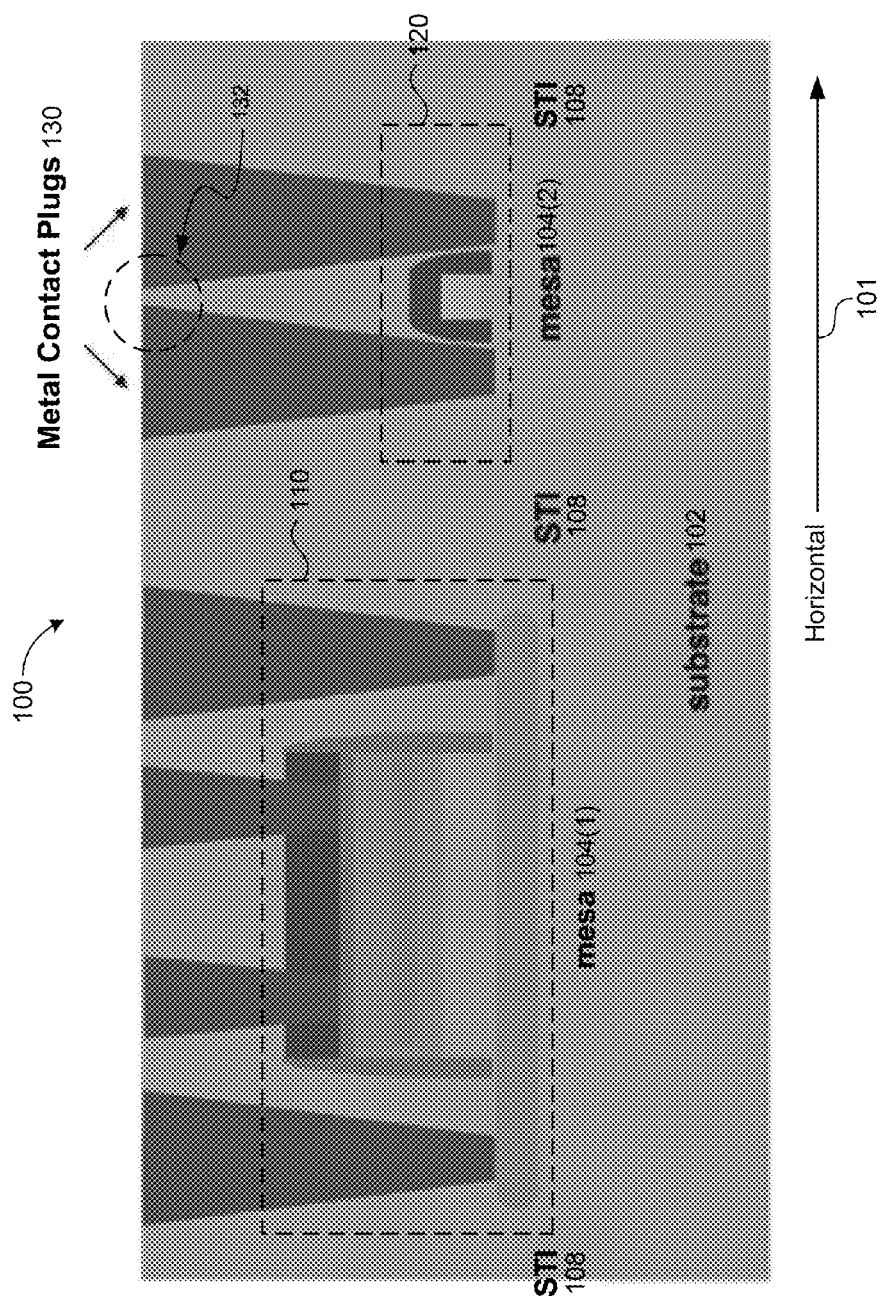
FIG. 1 is a cross-sectional view of a conventional monolithic integrated semiconductor structure having a normal incidence photodetector (PD) and a complementary metal oxide semiconductor (CMOS) field effect transistor (FET).

FIG. 1 is a cross-sectional view of a conventional monolithic integrated semiconductor structure 100 having a normal incidence PD device 110 and a CMOS field effect transistor (FET) (MOSFET) device 120. Both devices 110 and 120 are fabricated on substrate 102, typically silicon based. Also shown in FIG. 1 are shallow trench isolation (STI) features 108 that separate the PD 110 and the transistor 120. The STI is an integrated circuit features which prevents or reduces electric current leakage between adjacent semiconductor device components. The STI features 108 are typically formed early during the semiconductor device fabrication process, before transistors are formed. Example key steps of the STI process include etching a pattern of trenches on the top surface of the silicon substrate 102, depositing one or more dielectric materials (e.g., silicon dioxide) to fill the trenches, and removing the excess dielectric. After the STI features are formed on the substrate 102, devices then can be formed on these isolated "islands," called mesa (e.g., mesa 104(1) and mesa 104(2)).

In the integrated circuit (IC) chip fabrication industry, the process of fabricating a semiconductor wafer is divided into different stages or groups of steps. These stages are commonly known as front-end-of-line (FEOL), middle-of-line (MOL) and back-end-of-line (BEOL). The FEOL stage generally refers to the stage for forming devices (e.g., transistors) on or in a semiconductor wafer, e.g., forming doped regions, active areas, etc. The MOL stage is the stage where conductive structures are connected to the FEOL devices. The BEOL stage is the stage for final wafer processing where an active region is connected to outside circuitry. Note that, one or more aspects of the techniques introduced here have the effect of breaking the traditional boundaries (and the limitations associated therewith) among FEOL, MOL, and BEOL for fabricating photodetectors during monolithic integration; therefore, for purposes of this disclosure, the FEOL stage ends when the transistor devices are formed (i.e., without their contact plugs), and the BEOL stage starts at the deposition of the first interconnect metal layer (M1), all irrespective of the fabrication progress of the photodetector devices.

Specifically, in a typical IC chip build, the MOL stage bridges the FEOL stage to the BEOL stage. Like said, the FEOL stage forms the semiconductor devices, the BEOL stage forms interconnects and wiring. The MOL stage typically connects the FEOL and BEOL by using interconnect materials that prevent the diffusion of BEOL metals to FEOL devices. Specifically, the FEOL transistor devices are typically processed using single crystal and/or poly-crystalline silicon. The BEOL interconnects are typically made of multiple low electrical resistivity metals; the bulk of the conductor is copper or aluminum. If copper or aluminum diffuses into the FEOL silicon based devices, then it can cause transistor characteristics degradation. This is a main reason for the MOL connection. This connection is usually made of refractory metals, such as tungsten, and perhaps some barrier layers such as titanium nitride (TiN) and titanium tungsten (TiW). Although tungsten has a higher resistivity compared to other metals, its ability to prevent copper diffusion while still maintaining sufficient conductivity is desirable. Moreover, refractory metals typically have much higher electromigration resistance than copper or aluminum, thereby providing better device reliability under high electrical stress.

As illustrated in FIG. 1, with the large step height difference between the PD 110 and the transistor 120, the height of the transistor's MOL contact plugs 130 needs to be largely raised to match the PD's height. However, contact plugs for devices, similar to vias between metal interconnect layers, generally are created or opened by using directional dry etching, which inherently provides a tapered shape toward transistor source/drain area for electrical connection. With this tapered nature and given that the distance between the source and drain areas for a specific semiconductor technology is typically fixed, if the contact plug's height is too large, then the contact plugs for the source and drain of the transistor 120 can become too close to or even overlap with each other, such as illustrated by the area 132 of FIG. 1. This presents a serious reliability problem because the area 132 can easily create an electrical short between the source and drain areas of the transistor 120.

In addition to the reliability issues, given a specific semiconductor manufacturing technology, it is typical that a transistor's performance is tightly coupled to its physical dimensions, including the height of its contact plugs. Therefore, having unusually tall metal contact plugs causes higher-than-designed parasitic resistance for the CMOS transistors, which can adversely affect the performance of the transistor 120.

Even further, another issue is the extra thermal requirement that is placed on the CMOS FET devices when they are fabricated alongside with PD devices, exposing the FET devices to PD related processes. More specifically, high speed PDs are typically made out of photosensitive materials, such as Ge, GaAs, and InGaAs, that are not stable at certain CMOS FET's FEOL process temperatures. On the other hand, the epitaxial temperature of PD photosensitive materials is generally higher than the tolerance temperature of BEOL metals.

Among other reasons, such as the choice of the materials for silicide formation, the aforesaid temperature constraint and step height limitation have made it very difficult to choose an appropriate insertion point for the photosensitive materials during the monolithic integration process. These issues are exacerbated when the technology moves toward higher speed PD (e.g., transmission rate >25 Gbps) and more advanced CMOS technology node (e.g., technology node <90 nm); for example, because when the transistor gate length becomes shorter, the source and drain are even more closer to each other, thereby creating design difficulty and reliability issues for long contact plugs.

Accordingly, introduced here are various techniques to alleviate or overcome these problems that come with the monolithic integration of PD and transistor. Examples of the various techniques introduced here include, but not limited to, a mesa height adjustment approach during shallow trench isolation (STI) formation (or simply referred to as the modified STI approach), a transistor via first approach, and a multiple absorption layer approach. As described further below, the techniques introduced herein include a variety of aspects that can individually and/or collectively resolve or mitigate one or more traditional limitations involved with manufacturing PDs and transistors on the same substrate, such as above discussed reliability, performance, and process temperature issues. With the introduced techniques, it is possible to maintain the transistor's designed performance and also implement a PD thick enough to have good performance, without the traditional dilemma of either sacrificing the transistor's performance and reliability or the PD's performance because of the step height difference between the two devices.

In the following description, the example of monolithic integration between a PD and a CMOS transistor is used, for illustrative purposes only, to explain various techniques that can be implemented for manufacturing PD and transistor on the same substrate. Note, however, that the techniques introduced here are not limited in applicability to any particular kind of PD and/or transistors. For example, at least some of the techniques introduced here can be used for BiCMOS transistors and/or waveguide-based PDs.

Further, in the following description, numerous specific details are set forth to provide a thorough understanding of the present disclosure. It will be apparent to one skilled in the art that the techniques introduced here may be practiced without these specific details. In other instances, well-known features, such as specific fabrication techniques, are not described in detail in order to not unnecessarily obscure the present disclosure. References in this description to "an embodiment," "one embodiment," or the like, mean that a particular feature, structure, material, or characteristic being described is included in at least one embodiment of the present disclosure. Thus, the appearances of such phrases in this specification do not necessarily all refer to the same embodiment. On the other hand, such references are not necessarily mutually exclusive either. Furthermore, the particular features, structures, materials, or characteristics may be combined in any suitable manner in one or more embodiments. Also, it is to be understood that the various exemplary embodiments shown in the figures are merely illustrative representations and are not necessarily drawn to scale.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicate that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one material layer with respect to other material layers. As such, for example, one layer disposed "over" or "under" another layer may be directly in contact with the other layer or may have one or more intervening layers. Moreover, one layer disposed "between" two layers may be directly in contact with the two layers or may have one or more intervening layers. In contrast, a first layer "on" a second layer is in contact with that second layer. Additionally, the relative position of one layer with respect to other layers is provided assuming operations are performed relative to a substrate without consideration of the absolute orientation of the substrate. The term "atop" means "on the top of."

Similarly, the terms "above" and "below" are generally used herein for describing the relative physical location of different devices, layers, sections, portions, etc., with respect to their shortest distances to the semiconductor substrate. For example, a first layer "above" a second layer means that, when measured from the substrate at the same horizontal level, the first layer is farther away in distance from the substrate than the second layer. Conversely, a first layer "below" a second layer means that, when measured from the substrate at the same horizontal level, the first layer is closer in distance from the substrate than the second layer. As used herein, "horizontal" means parallel to the planar surface of the substrate, such as the horizontal axis 101 illustrated in FIG. 1.

The term "immediately" or "directly" may be construed as "in physical contact," as will be made apparent by the context; for example, unless contradictory to the context, a first layer "immediately above" or "directly above" a second layer means that the first layer is above and in physical contact with the second layer.

As used herein, "contact plug," "contact via," or simply "contact" for a device refers to any substantially vertical wire between with the doped regions for the device and the first interconnect layer for the device. The term "interconnect" refers to any substantially horizontal wire between devices for inter-device signal transmission/communication. The "first" interconnect layer refers to the lowest interconnect layer. Notably, with the techniques introduces here, the first interconnect layer is device specific; that is to say, in some embodiments, the first interconnect for one device may be different than that for another device, even when both devices are fabricated on the same wafer.

Mesa Height Adjustment Approach During Shallow Trench Isolation Formation

Figure 2:
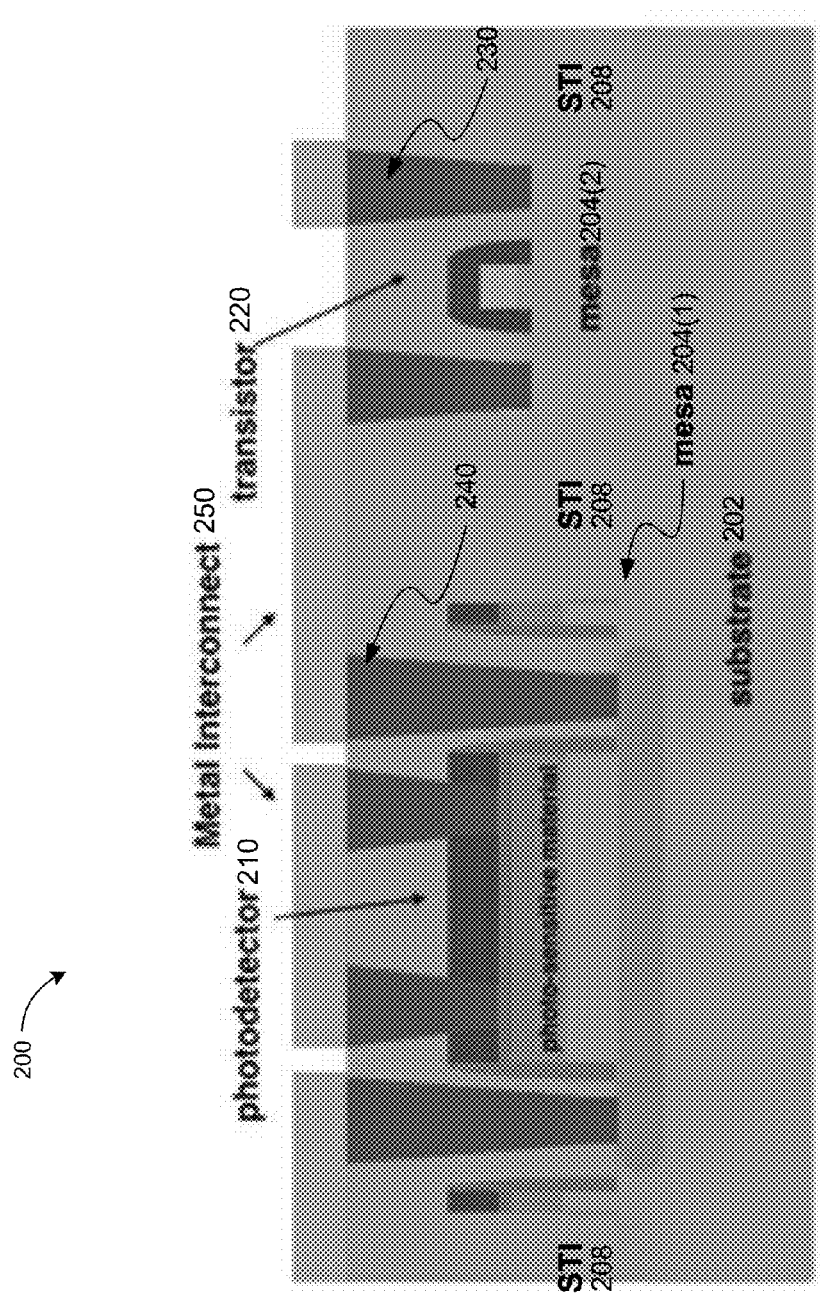
FIG. 2 is a cross-sectional view of a monolithic integrated semiconductor structure incorporating one or more aspects of the disclosed techniques.

FIG. 2 is a cross-sectional view of a monolithic integrated semiconductor structure 200 incorporating one or more aspects of the disclosed techniques. The structure 200 includes a PD device 210 and a transistor device 220. Both devices 210 and 220 are fabricated on substrate 202. Also shown in FIG. 2 are shallow trench isolation (STI) features 208, which are formed on the substrate 202 by performing etching before the devices 210 and 220 are fabricated, leaving mesas (e.g., mesa 204(1) and mesa 204(2)) on which devices 210 and 220 can be formed.

As mentioned above, one issue associated with the conventional monolithic integration of PD and transistor is the large step height difference between PD and transistor. Accordingly, one aspect of the techniques introduced here includes a modified STI approach for reducing the step height difference. More specifically, after forming the STI features 208 (and their counterpart mesas) on the semiconductor substrate 202, an additional step is performed to adjust the relative height between the mesa for the photodetector 210 (e.g., mesa 204(1)) and the mesa for the transistor 220 (e.g., mesa 204(2)) in order to compensate the step height difference. This can be performed by reducing the height of the mesa 204(1) for the photodetector 210 (e.g., via etching the mesa 204(1)), or by increasing the height of the mesa 204(2) for the transistor 220 (e.g., via growing additional substrate material on the mesa 204(2)). The adjusting can be performed until the top surface of the mesa 204(1) for the photodetector 210 becomes lower than the top surface of the mesa 204(2) for the transistor 220 for height compensation.

Further, in a preferred embodiment, after the adjustment, the mesa 204(1) still remains higher than the bottom surface of the isolation trench STI 208. Depending on the field application, this may be preferable than not having the mesa 204(1) higher than the bottom of STI 208; example benefits of this preferred embodiment may include that (1) such structure provides better device isolation, especially for the PD device, (2) such structure provides more flexibility of controlling the PD device height, and (3) such structure reduces STI dielectric dishing during STI chemical-mechanical polishing (CMP).

After the above mesa height adjustment, the transistor 220 and the PD 210 can be fabricated on their respective mesas 204(2) and 204(1). With the modified STI approach introduced here, the issue of step height difference between PD and transistor may be reduced.

Figure 3A:
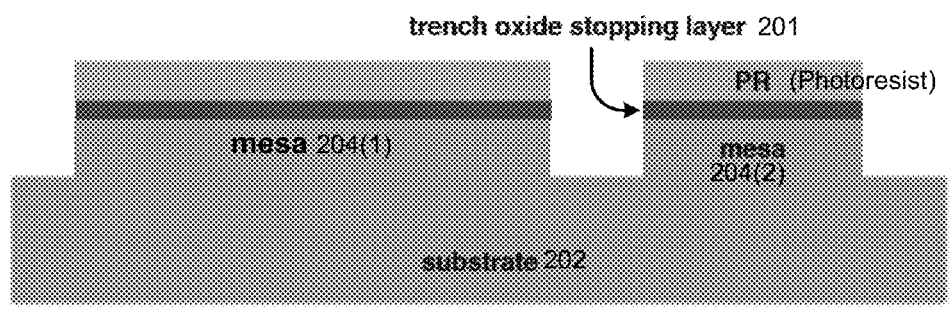
FIGS. 3A-3R are cross-sectional views showing various process steps for manufacturing the semiconductor structure of FIG. 2 in accordance with some embodiments.
Figure 3B:
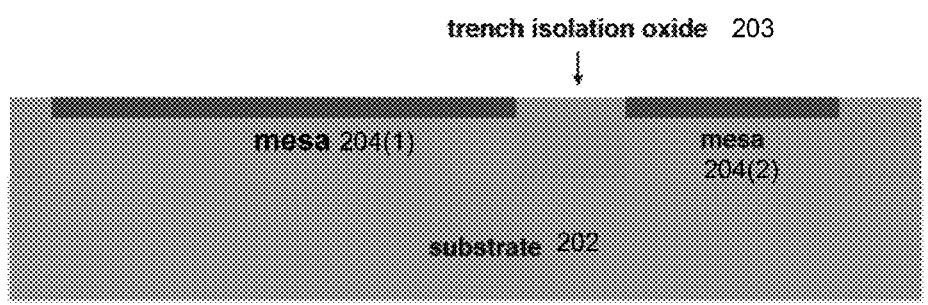
Figure 3C:
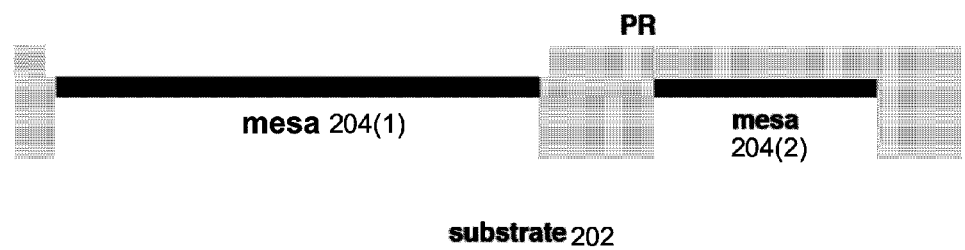
Figure 3D:
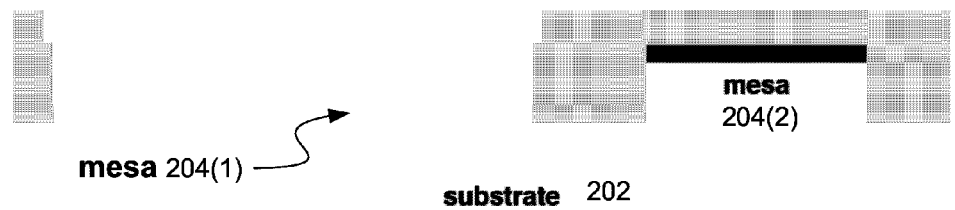
Figure 3E:
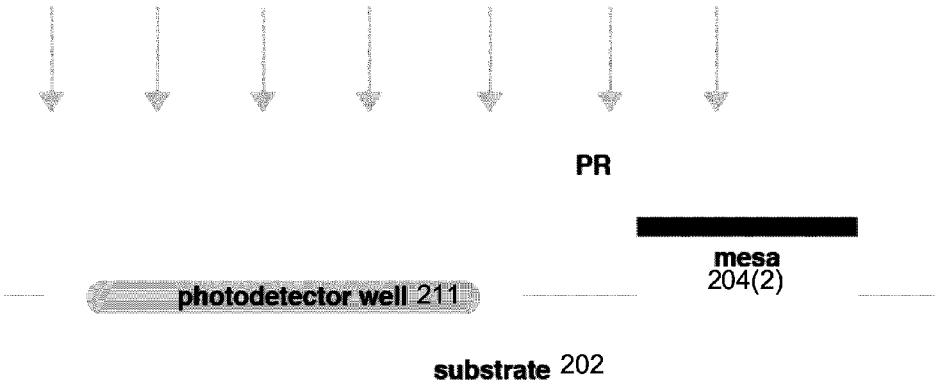
Figure 3F:
Figure 3G:
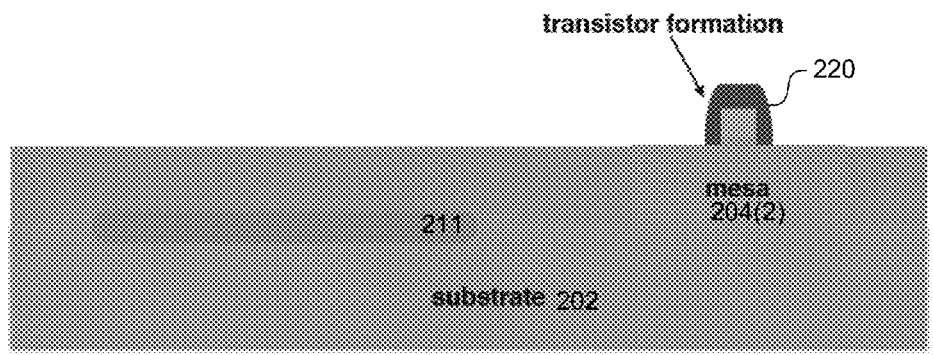
Figure 3H:
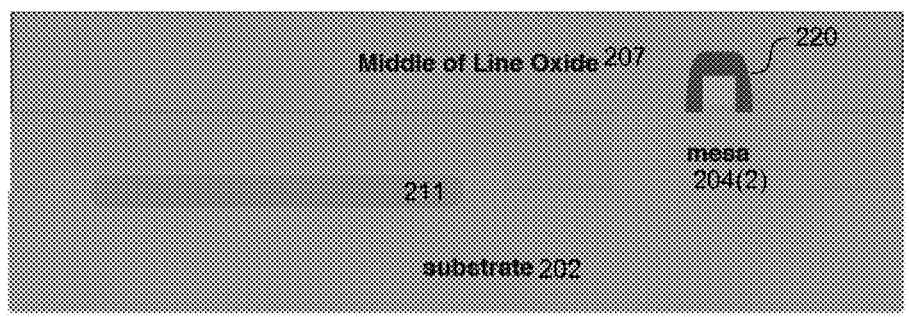
Figure 3I:
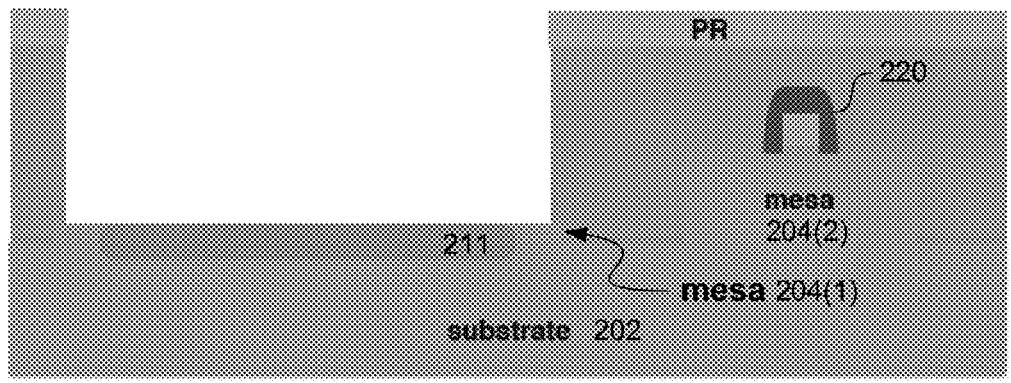
Figure 3J:
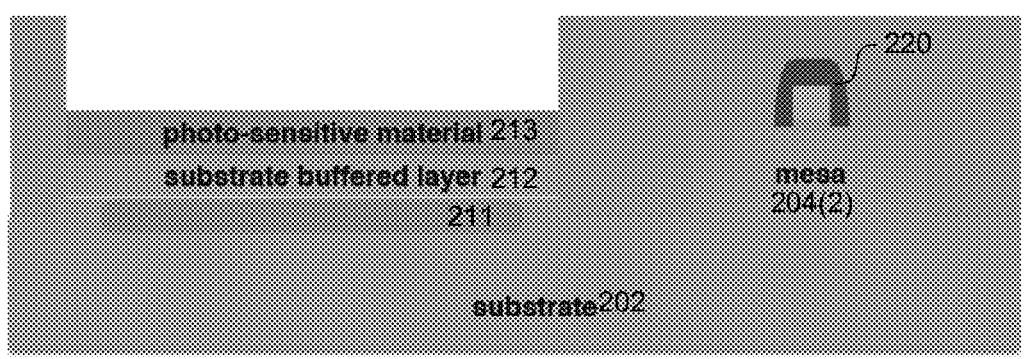
Figure 3K:
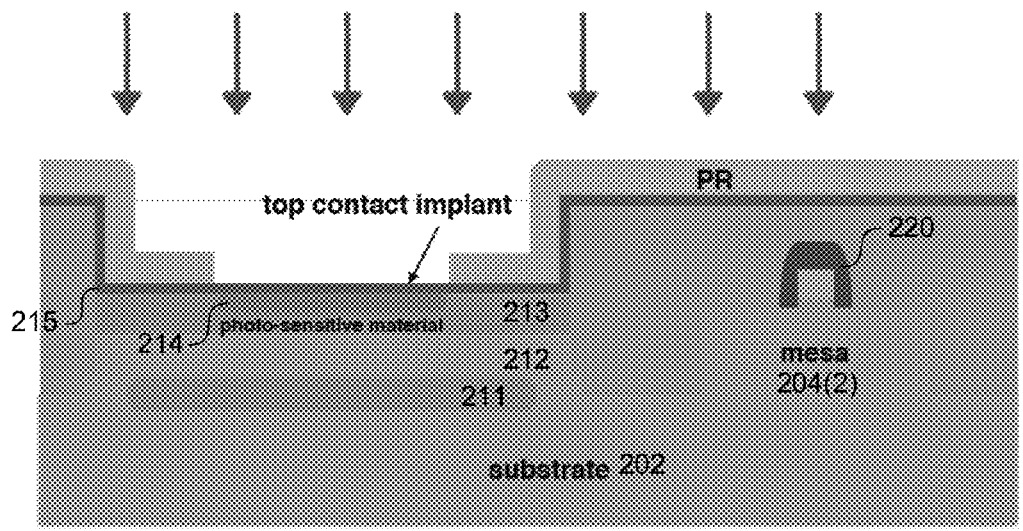
Figure 3L:
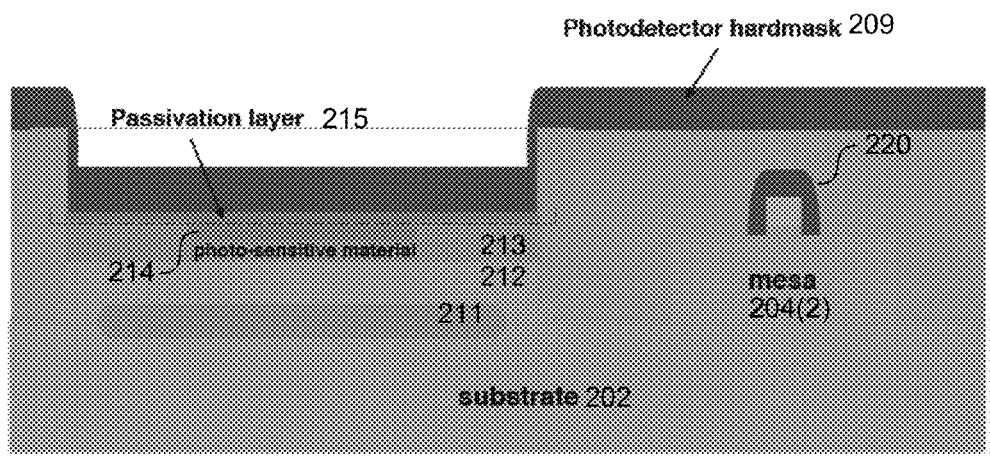
Figure 3M:
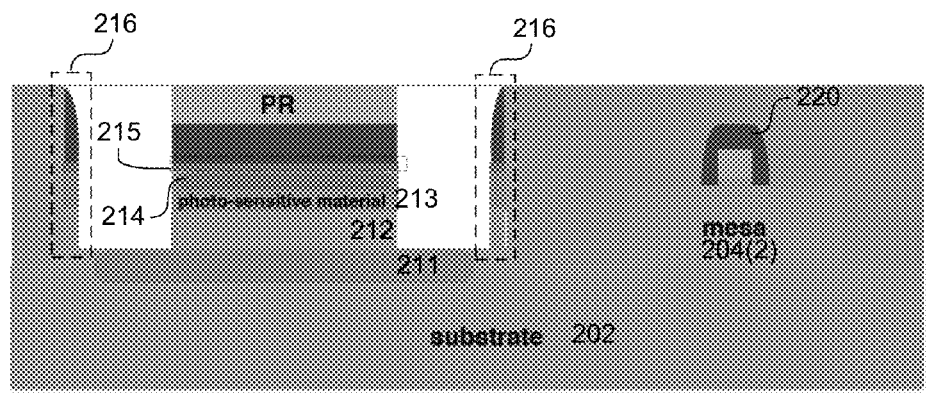
Figure 3N:
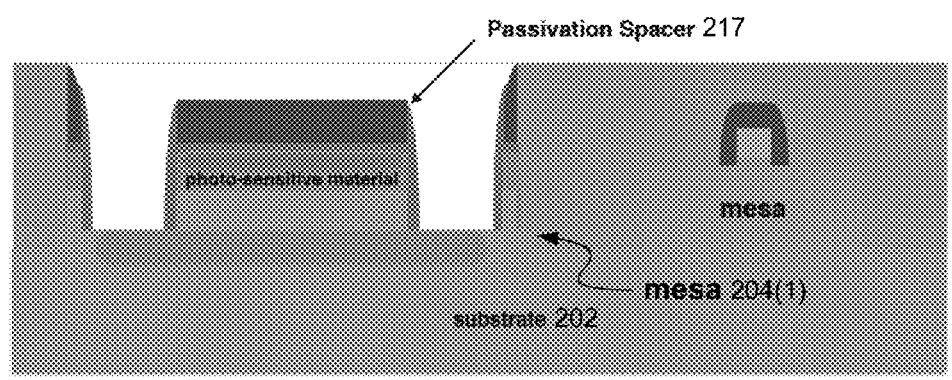
Figure 3O:
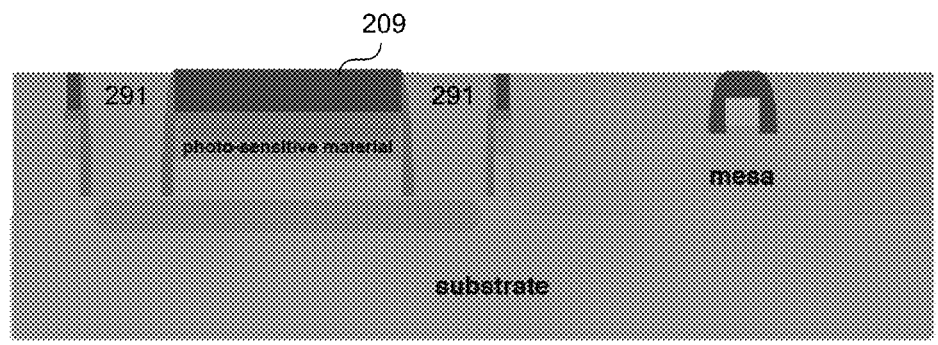
Figure 3P:
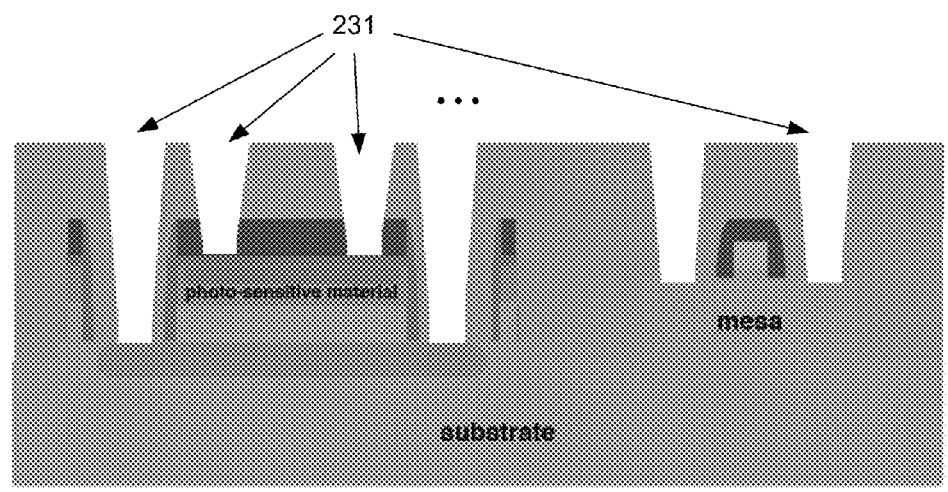
Figure 3Q:
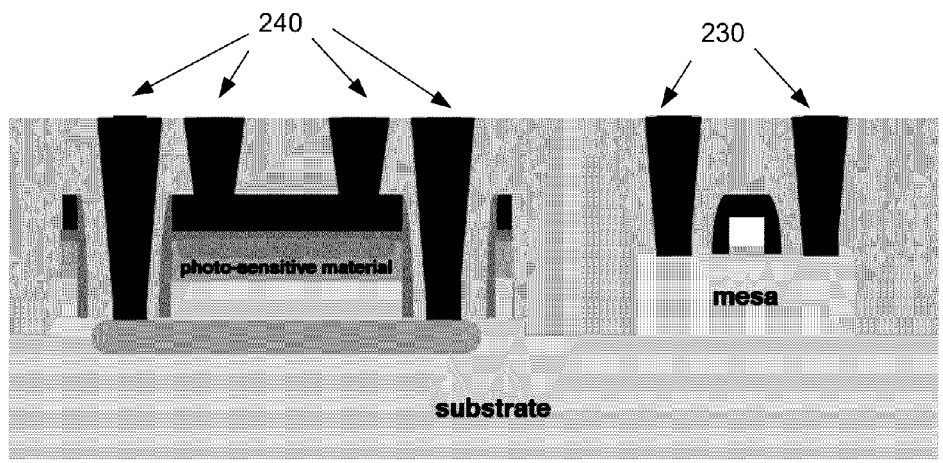
Figure 3R:
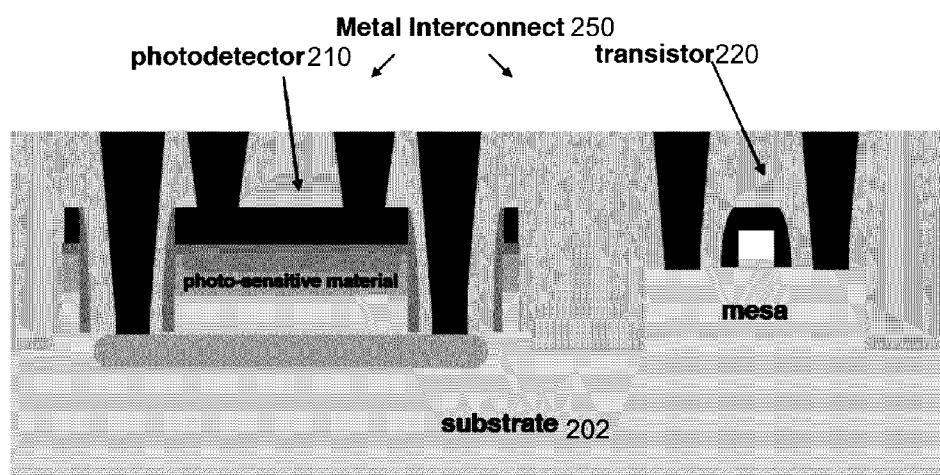

FIGS. 3A-3R are cross-sectional views showing various process steps for manufacturing the semiconductor structure 200 of FIG. 2 in accordance with some embodiments. Note that, while these process steps that are described and/or depicted as performed in a specific order, these steps may include more or fewer steps, which may be performed in serial or in parallel. Also, an order of two or more steps may be changed, performance of two or more steps may overlap, and two or more steps may be combined into a single step. In addition, while the steps introduced here may include certain details for fabricating a specific embodiment (such as structures depicted in FIGS. 2, 4A, and 6A), one or more of these steps may be modified to create different variations of embodiments (such as structures depicted in FIGS. 4B, 6B, or described in other portions here). Any obvious modification to the steps for creating those variant embodiments introduced here is omitted for simplicity. For example, in one variant, the height for the mesa 204(1) of the PD device 210 is reduced to the same height as the bottom of the STI features 208, and an ordinary artisan will know how to add, remove, and/or modify the steps introduced here for fabricating such variant. Well known steps or details may be omitted for simplicity.

With reference to FIGS. 3A-3R, example process steps for manufacturing the semiconductor structure 200 are introduced. In step 301 (FIG. 3A), a stopping layer 201 is deposited on the substrate 202 for forming the STI trenches on the substrate 202. The stopping layer 201 has patterns that define the STI features (and also the complementary mesa features). Then, the transistor and photodetector active areas (mesa structures 204(2) and 204(1), respectively) are patterned and defined (e.g., by using etching).

In step 302 (FIG. 3B), isolation material (e.g., oxide) 203 is deposited and polished down to stopping layer surface by CMP, thereby forming the STI. In step 303 (FIG. 3C), a thin layer of oxide is deposited over the wafer to protect the transistor active areas (e.g., mesa 204(2)). The oxide on top of photodetector active area is then defined by lithography and removed. In step 304 (FIG. 3D), the photodetector's stopping layer is removed, and the height for PD substrate mesa (e.g., mesa 204(1)) is reduced. For example, the height reduction process can be done by wet chemical etch or dry etch (e.g., using chemicals with high etching selectivity to the substrate material). The amount of height reduction can be determined based on the height difference between transistors and photodetectors in the design. In alternative implementations, an epitaxial growth can be performed on the mesa 204(2) to elevate its height. In effect, a relative height between the mesa 204(1) and the mesa 204(2) is adjusted.

In step 305 (FIG. 3E), ion implantation is performed on the photodetector active areas to define the well slabs 211. In step 306 (FIG. 3F), oxide 205 is deposited over the wafer to protect the photodetector area, followed by a CMP planarization process that ends at the transistor's stopping layer. In step 307 (FIG. 3G), transistors (e.g., transistor 220) are formed on top of their respective mesa active areas (e.g., mesa 204(2)). Note that step 307 marks the end of the FEOL stage. In step 308 (FIG. 3H), middle-of-line oxide 207 is deposited to cover over transistors, and then planarized. In step 309 (FIG. 3I), the oxide layer on top of the photodetector active areas is removed to expose the photodetector mesas (e.g., mesa 204(1)).

In step 310 (FIG. 3J), photosensitive material 213 is selectively deposited so that it is only deposited on the photodetector active area. In some implementations, the photosensitive material 213 includes germanium, and facets can be formed during the epitaxy process near the sidewall of the mesa 204(1). In some embodiments, a buffered material 212 is deposited before depositing the photosensitive material 213. The buffered material 212 typically is a material that is similar or equivalent to substrate material. In step 311 (FIG. 3K), a passivation layer 215 can be formed by first depositing a blanket passivation layer, followed by top contact implantation, doping the upper region 214 of the photosensitive layer 213 to the opposite polarity than the doped substrate layer 211. Note that, in this example, the layer 214 is formed after passivation layer formation, and therefore a portion of the passivation layer 215 becomes doped to form at least partially the layer 214. Then, in step 312 (FIG. 3L), the passivation layer 215 is patterned with lithography and dry etching processes, leaving this passivation layer 215 only above photosensitive material 213. As an alternative, in step 311, the upper region 214 of the photosensitive layer 213 is first doped to the opposite polarity than the doped substrate layer 211, and then in step 312, the passivation layer 215 is selectively deposited so that it is only deposited on the photosensitive material 213. The doped upper region 214 may be defined by ion implantation or by in-situ doping during the epitaxy process. Thereafter, a photodetector hard mask layer 209 is deposited over the entire wafer. The hard mask layer 209 can be used for patterning photodetector mesas as well as the CMP or etch back stopper at the interlayer dielectric layer planarization stage.

In step 313 (FIG. 3M), photodetector mesas are patterned with typical lithography and dry etching processes. In one or more embodiments, there are rings 216 of photosensitive material left nearby the oxide sidewall when using this patterning scheme, as shown in FIG. 3M. Further, in some embodiments, the rings 216 may be removed, but note that the removal process may increase cost and technical difficulty, because the rings 216 share similar structure and materials with the photodetector 210. Then, in step 314 (FIG. 3N), passivation spacer 217 is formed at the sidewall of the photodetector mesa 204(1). In accordance with some implementations of this process scheme, the sidewall spacer 217 can be formed next to the photosensitive ring 216 near the oxide edge as well. In step 315 (FIG. 3O), interlayer dielectric 291 is deposited to fill up the gap between photodetector mesa and original oxide. Then, planarization is applied via etch back or CMP. In some variations, the hard mask 209 is used as the planarization stopping layer, and in some examples, another dielectric layer can deposited on the top of the wafer afterwards to ensure uniform dielectric thickness above the photodetector mesas across the wafer for optical purposes. In some implementations, step 313 through step 315 can be skipped, and step 316 can be performed immediately after the top passivation layer formation (step 311).

In step 316 (FIG. 3P), openings 231 for contact vias of both photodetectors and transistors are formed. Note that, because of the various contact depths between the two kinds of devices, separate contact open processes may be needed. In addition, silicide formation can be performed during or before contact via formation to improve contact resistance, thus improving device performance. Then, in step 317 (FIG. 3Q), metal formation for both transistor contact vias 230 and PD contact vias 240 is performed by metal deposition and CMP. In step 318 (FIG. 3R), standard backend-of-line metal interconnects 250 are formed. The communication between these two types of devices (e.g., PD 210 and transistor 220) can be achieved through the first metal layer (i.e., M1) or any layer above, in accordance with one or more embodiments.

In one or more implementations, the photo-sensitive material 213 is or includes germanium (Ge). Example material for the substrate 202 can be silicon (Si) or silicon-oninsulator (SOI). The passivation layer 215 can be amorphous-Si, poly-crystalline Si, nitride, high-k dielectric, silicon dioxide ($SiO_2$), or any combination thereof. In some examples, the passivation spacer 217 can be amorphous-Si, poly-crystalline Si, nitride, high-k dielectric, silicon dioxide ($SiO_2$) or any combination thereof. The material for the photodetector hard mask layer 209 can be nitride, and the material for the interlayer dielectric 291 can be $SiO_2$. The trench isolation oxide 203 can be $SiO_2$, and the transistors (e.g., transistor 220) can be silicon-based transistors. The photodetectors (e.g., PD 210) can be of a normal incidence type in which the optical signal can be either incident from the top through the dielectric layer 493 or from the bottom through the substrate 402.

In some alternative embodiments, at least a part of the semiconductor materials used in the P-I-N structure can be different from semiconductor substrate material; for example, the highly doped P region and the intrinsic region can be germanium based, and the highly doped N region can be silicon based (e.g., the N region being defined on the silicon substrate). Further, in some embodiments, the intrinsic photosensitive region of the PD 210 includes a stack of semiconductor materials that include substrate semiconductor material with a smaller dielectric constant than the material in the intrinsic photosensitive region. In these embodiments, a thickness ratio between the substrate semiconductor material and other semiconductor materials in the intrinsic photosensitive region combined can be greater than 1 to 5 such that the effective capacitance can be reduced for higher operation speed. In other words, in some of these embodiments having the stack of semiconductor materials in their photosensitive regions, the thickness of the silicon layer in the stack is no thinner than ⅕ of the germanium layer in the stack in order to form a high bandwidth photodetector. In one example, the germanium layer is 500 nm, and the silicon layer is thicker than 100 nm.

In an alternative embodiment, the photodetector mesa is at the same level as the bottom of the STI trenches, thereby utilizing the full potential of compensating the step height difference between photodetectors and transistors. However, in such alternative, the device isolation (especially for PD devices) may not be as good as the embodiment shown in FIG. 2, and may have more oxide dielectric dishing problems during the STI CMP process.

Transistor Via First Approach

Figure 4A:
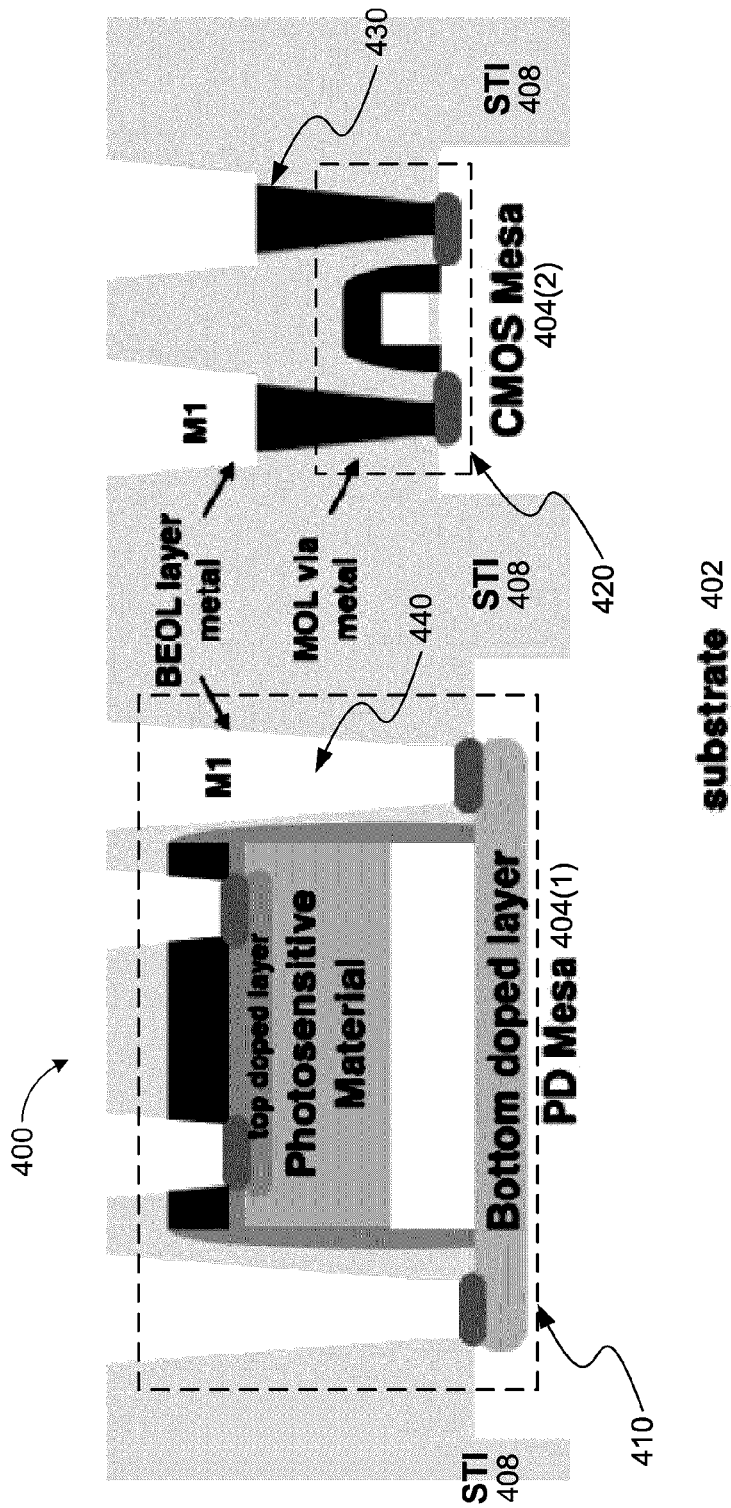
FIG. 4A is a cross-sectional view of another monolithic integrated semiconductor structure incorporating one or more aspects of the disclosed techniques.

FIG. 4A is a cross-sectional view of another monolithic integrated semiconductor structure 400 incorporating one or more aspects of the disclosed techniques. The structure 400 includes a PD device 410 and a transistor device 420. Both devices 410 and 420 are fabricated on substrate 402. Also shown in FIG. 4A are shallow trench isolation (STI) features 408, which are formed on the substrate 402 by performing etching before the devices 410 and 420 are fabricated, leaving mesas (e.g., mesa 404(1) and mesa 404(2)) on which devices 410 and 420 can be formed. The structure 400 may have transistors (e.g., transistor 420) located on one set of mesas formed specifically for the transistors, and PDs located on another set of mesas. In other implementations, the PD mesas 404(2) may optionally have lower height than transistor mesas 404(1) to further compensate the step height difference between PD 420 and transistor 410, as discussed above with respect to the modified STI approach.

As mentioned above, one issue associated with the conventional monolithic integration of PD and transistor is the large step height difference between PD and transistor. It is further observed in the present disclosure that standard MOL process (e.g., tungsten formation) is typically used for forming contact plugs for devices because of reliability reasons. Specifically, because transistors are forward biased devices, their working principle requires a relatively large amount of electrical current to pass through. If the contact plugs for the transistors are made of BEOL metal such as copper or aluminum, the large current can cause electromigration, leading to device malfunctions and/or shorter device lifetime. Moreover, this electromigration of BEOL metals can cause transistor characteristics degradation. Therefore, the MOL process uses refractory materials (e.g., tungsten) to form the contact plugs for transistors. However, photodetectors, unlike transistors, are reverse biased devices, meaning that their working principle does not require a large amount of current to pass through them.

Accordingly, one aspect of the techniques introduced here includes a modified contact via approach. In this particular approach, the contact vias for the transistors are fabricated such that they (1) have dimensions (e.g., height) that are optimized for the corresponding manufacturing technology (which is typically manufacturer specific) for performance purposes, and (2) adopt conventional refractory metal (e.g., tungsten) as contact metal for reliability purposes. In contrast, the contact vias for the PDs in this approach are fabricated during the back-end-of-line (BEOL) process and, in some embodiment, using BEOL interconnect metals, such as copper (Cu) or aluminum (Al) for forming at least a part of the PD contact plugs. Specifically, in some embodiments, transistors are first fabricated until the process in which their MOL contact vias (e.g., contact vias 430) are formed. The main body of the PDs are then fabricated. Thereafter, the PD contact vias (e.g., contact vias 440) are formed during the formation of BEOL interconnect metal layers (e.g., M1 layer). That is to say, as is described further below with respect to FIGS. 5A-5Q, the transistors are first formed on the semiconductor substrate during a front-end-of-line (FEOL) fabrication stage. Then, during a middle-of-line (MOL) fabrication stage and before the photodetectors are formed on the semiconductor substrate, contact plugs for the transistors are formed by using refractory materials. Next, the photodetectors are formed on the semiconductor substrate. Thereafter, contact plugs for the photodetectors are formed during a back-end-of-line (BEOL) fabrication stage.

This structure 400 introduced here further provides a way to resolve the step height issue as discussed above with respect to FIG. 1. Advantageously, this modified via formation approach removes the requirement of contacting both types of devices with the same MOL metal layer, thereby removing all the problems associated with such requirement. As observed herein, because PDs are operated under reverse bias with very low output current, there is little or no electromigration concerns using this modified contact via approach. Also, the mesa adjustment technique discussed above with respect to FIG. 2 can be optionally combined with this modified contact via approach. Benefits from combining the mesa adjustment technique include, for example, providing more complete protection on PD active area by dielectric during the transistor fabrication processes, and providing additional step height compensation for the two kinds of devices.

Figure 4B:
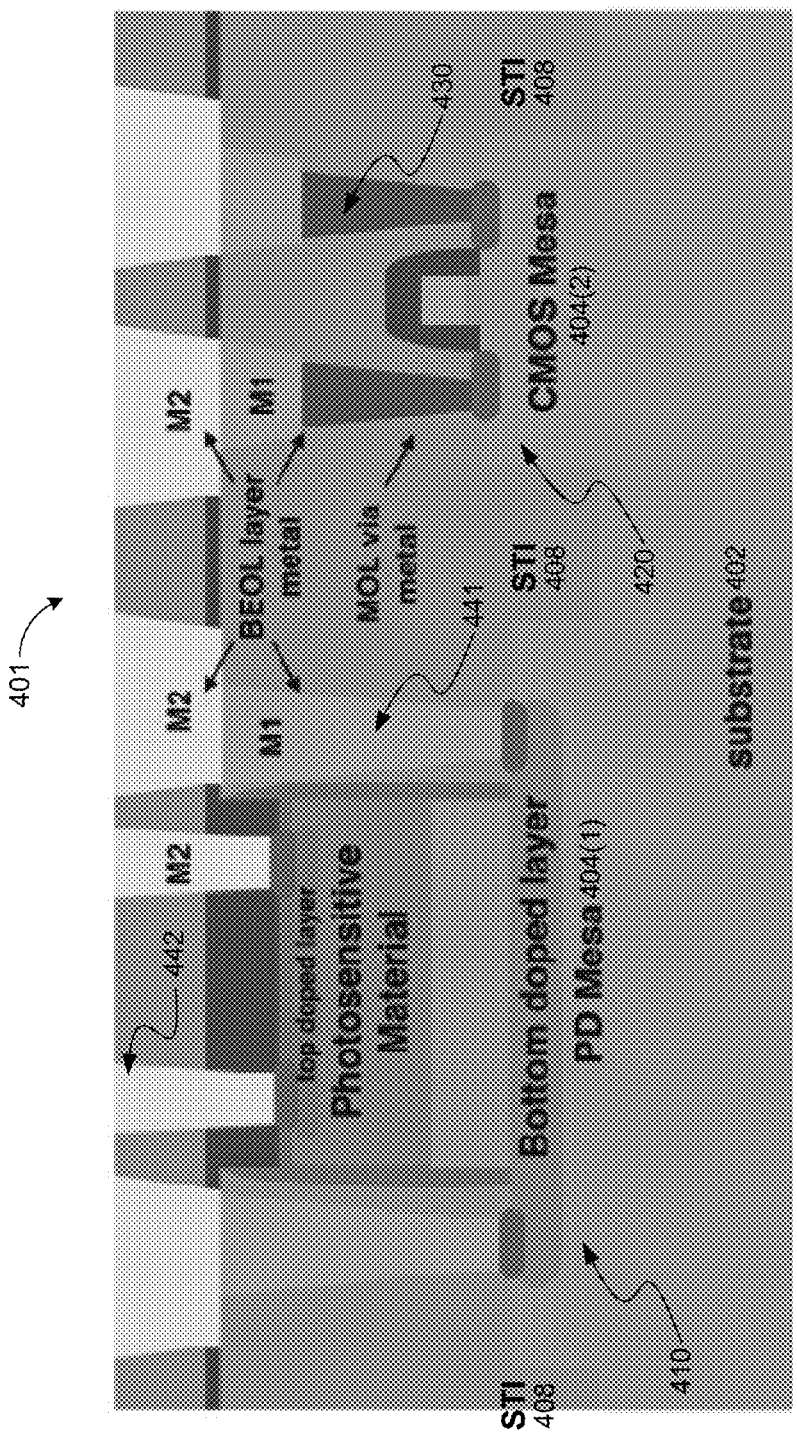
FIG. 4B is a cross-sectional view of a monolithic integrated semiconductor structure that is a variant of the structure shown in FIG. 4A.

FIG. 4B is a cross-sectional view of a monolithic integrated semiconductor structure 401 that is a variant of the structure 400 shown in FIG. 4A. The structure 401 shares similar design concepts as the structure 400, but with a different PD metal contact formation. Instead of using the first BEOL metal layer (i.e., M1) to form both the top and bottom contacts for the PD, this structure 401 uses the first BEOL metal layer (M1) to form the contact vias 441 that contact the bottom electrode and another metal layer above (e.g., the second BEOL metal layer (M2)) to form the contact vias 442 that contact the top electrode. This variant can be adopted for situations in which the step height difference between the PD and the transistor is too large for using only the first BEOL metal layer for height compensation.

Figure 5A:
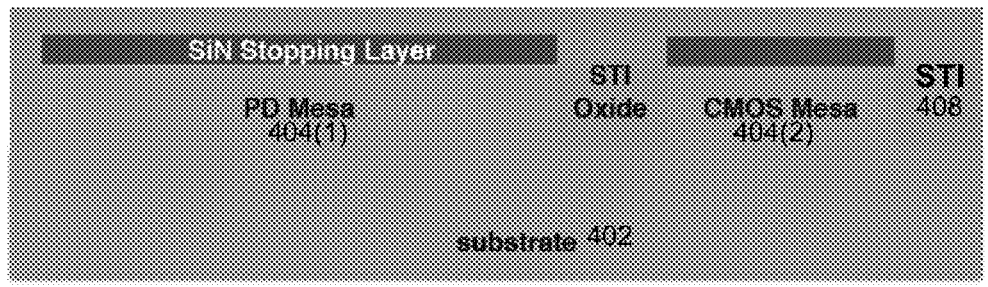
FIGS. 5A-5Q are cross-sectional views showing various process steps for manufacturing the semiconductor structure of FIG. 4A in accordance with some embodiments.
Figure 5B:
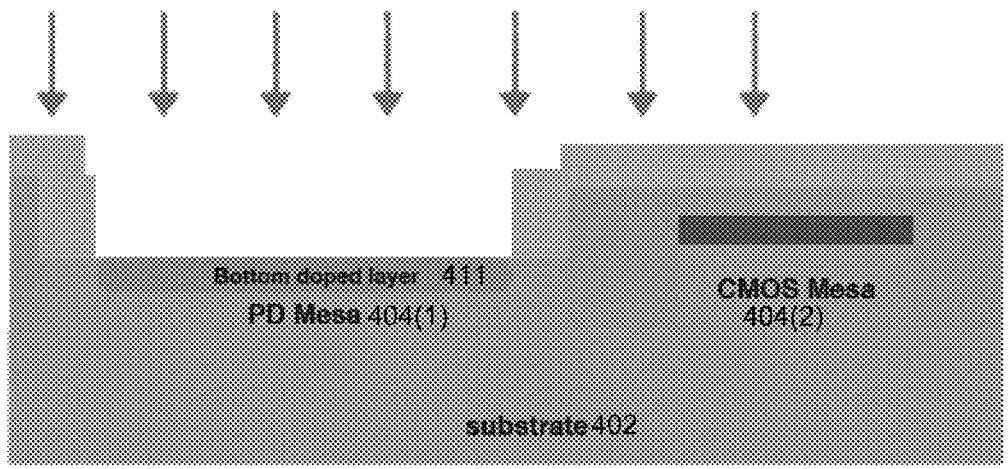
Figure 5C:
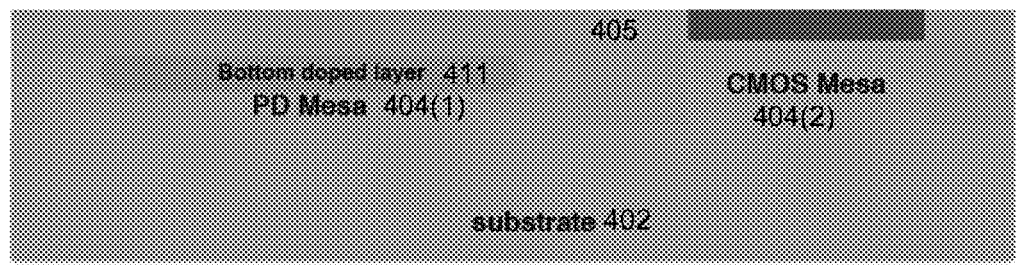
Figure 5D:
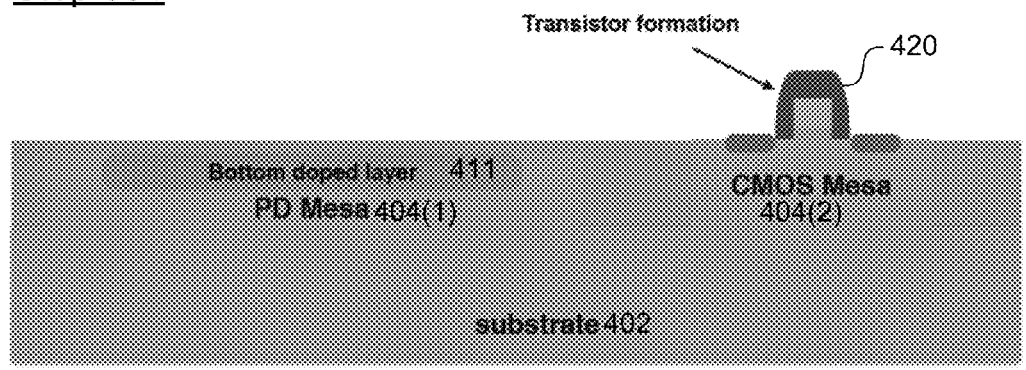
Figure 5E:
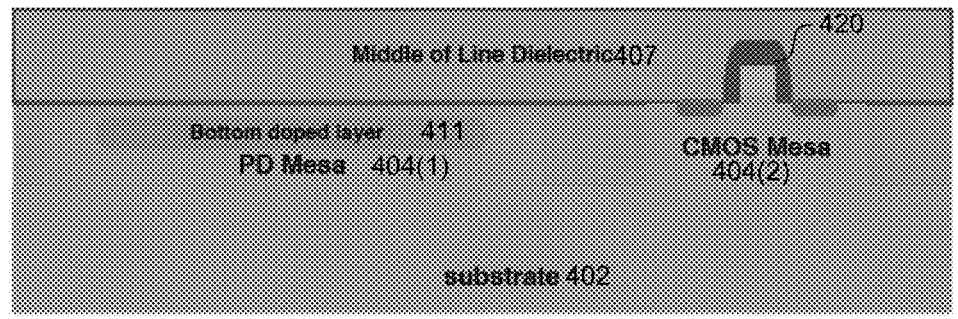
Figure 5F:
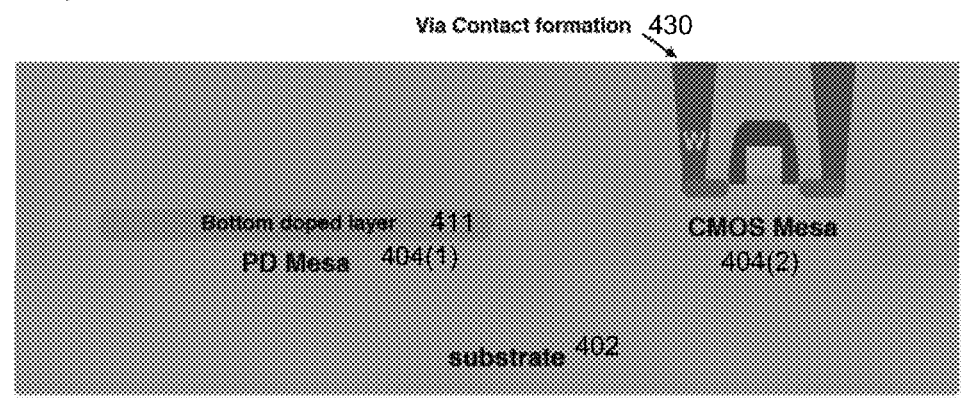
Figure 5G:
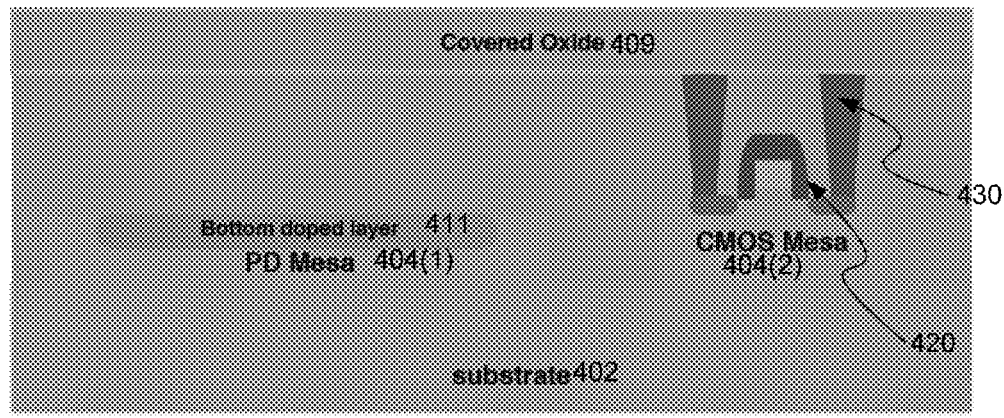
Figure 5H:
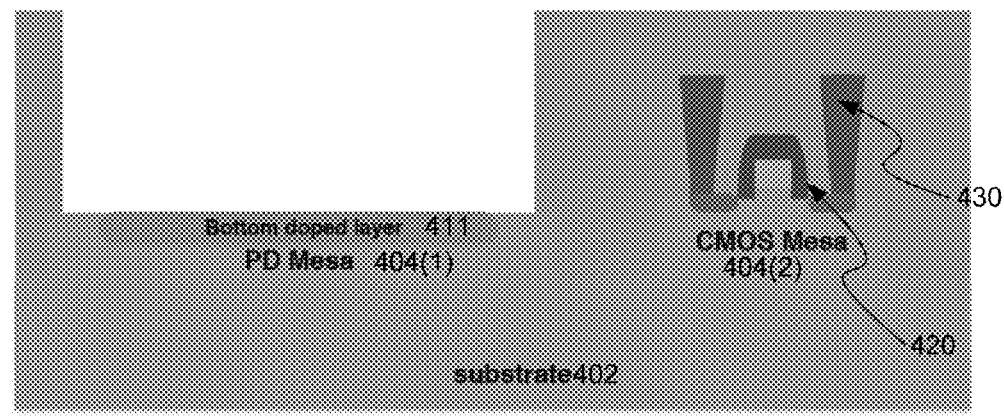
Figure 5I:
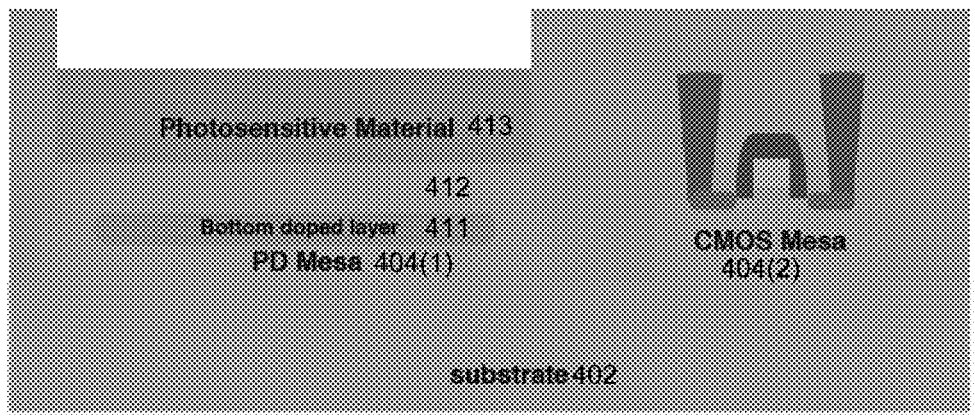
Figure 5J:
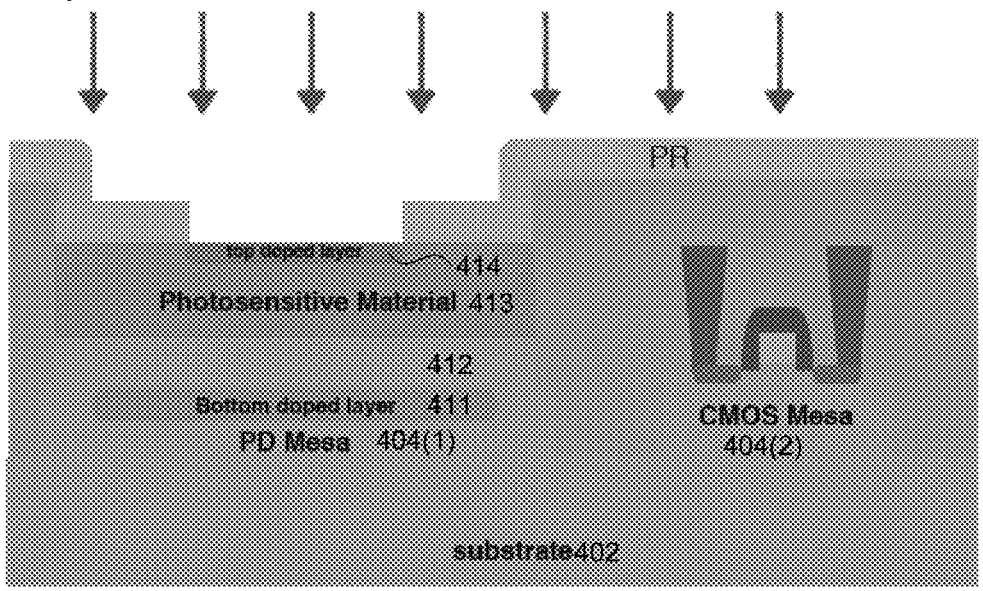
Figure 5K:
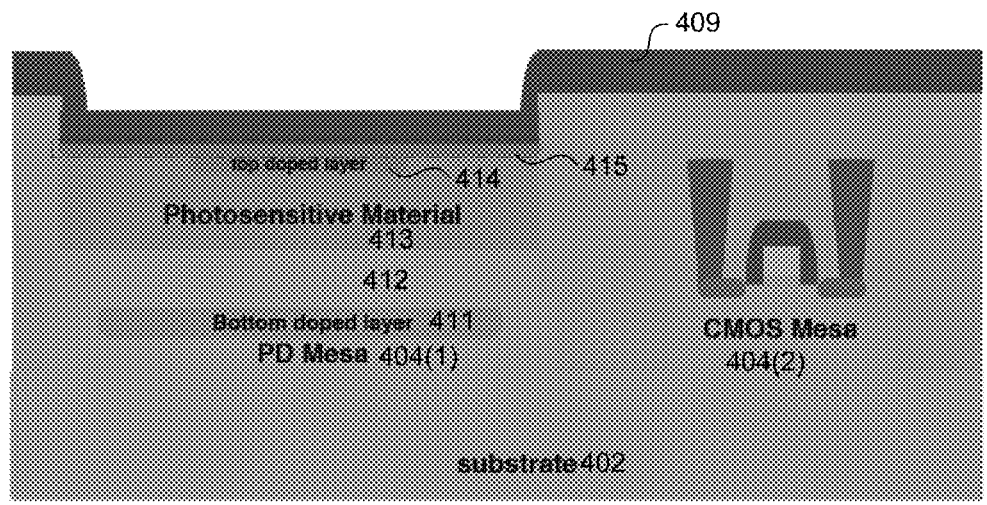
Figure 5L:
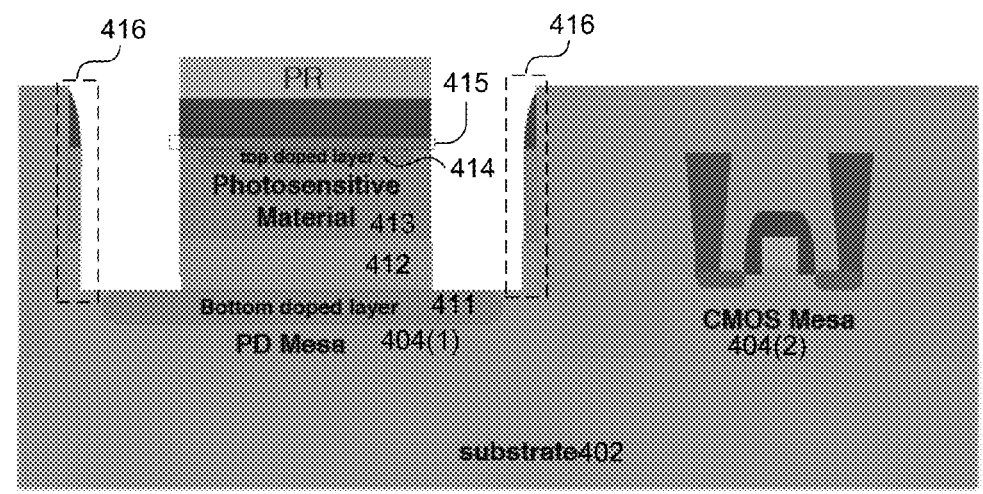
Figure 5M:
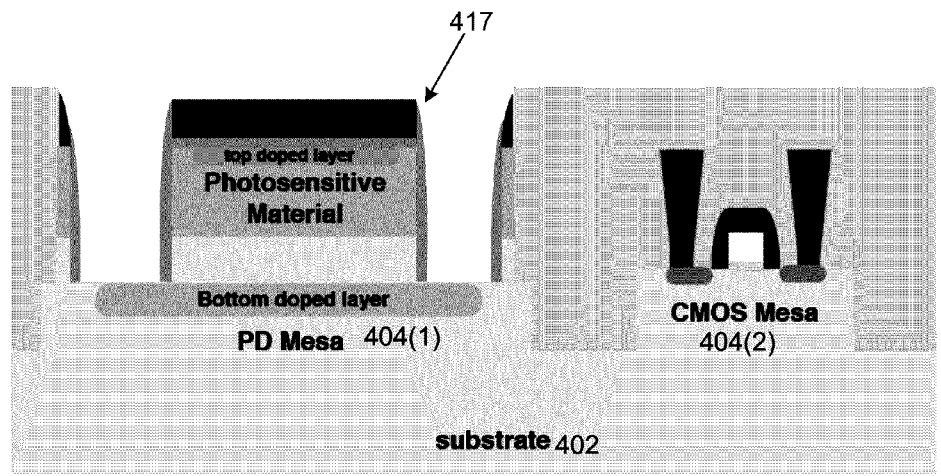
Figure 5N:
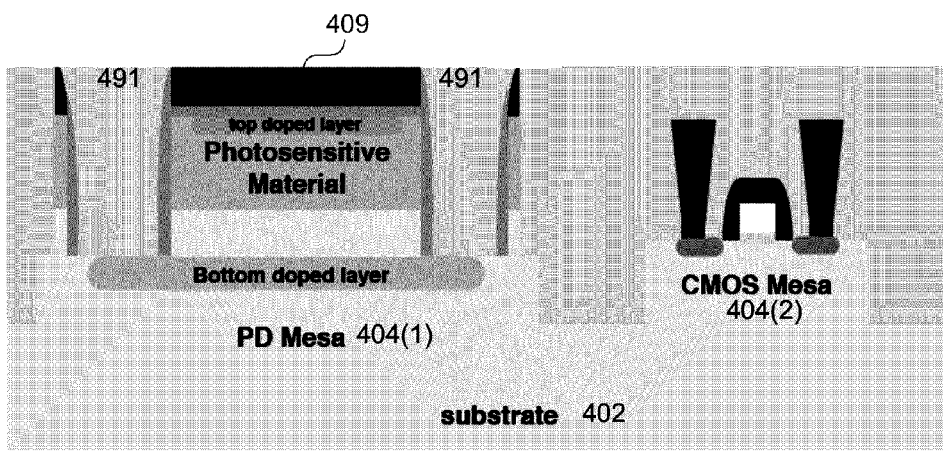
Figure 5O:
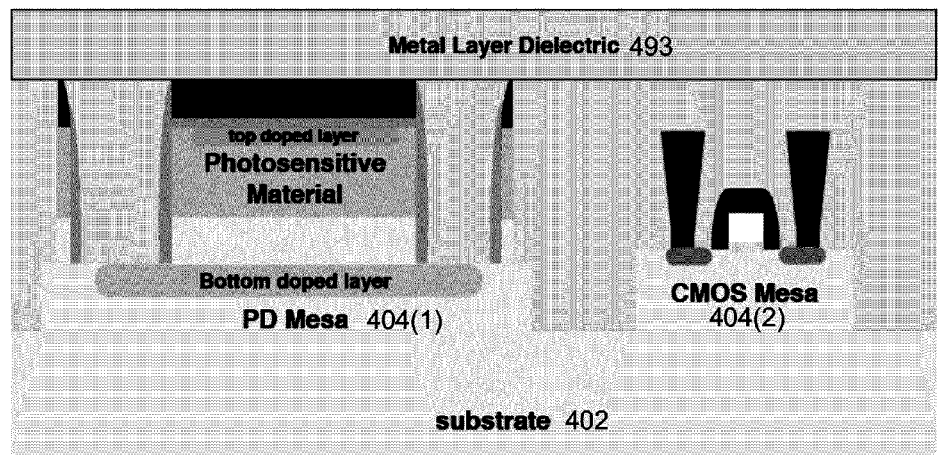
Figure 5P:
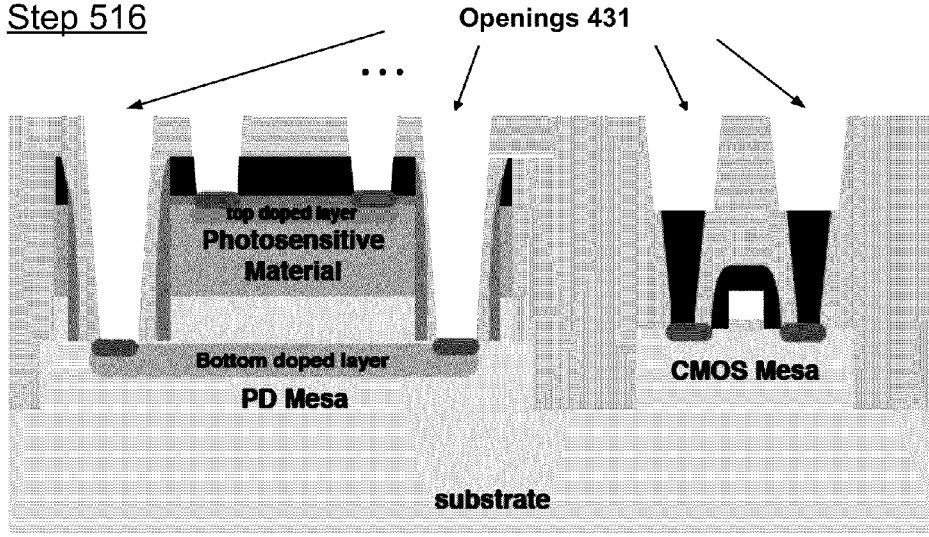
Figure 5Q:
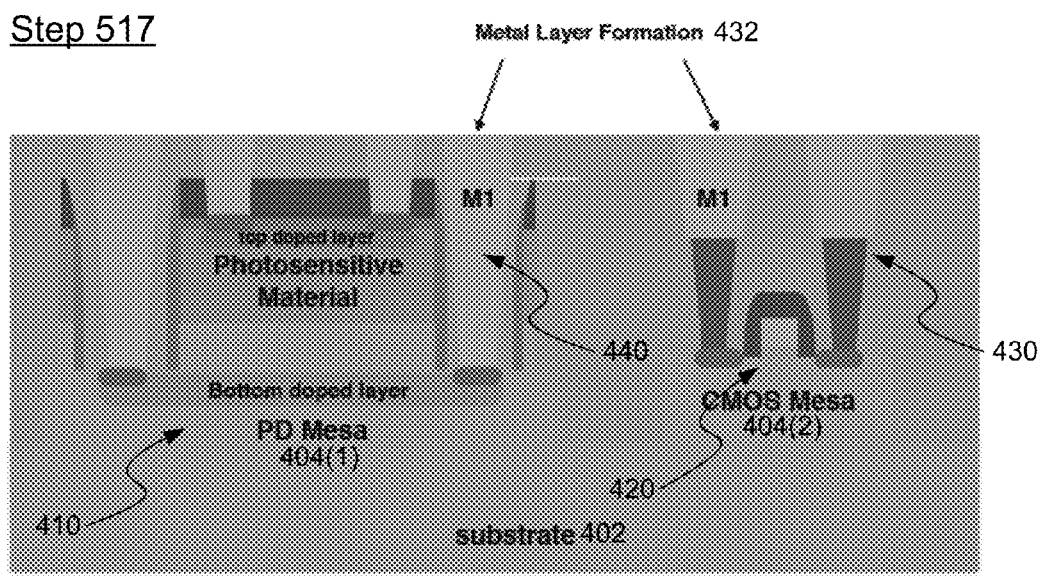

FIGS. 5A-5Q are cross-sectional views showing various process steps for manufacturing the semiconductor structure of FIG. 4A in accordance with some embodiments. Note that, while these process steps that are described and/or depicted as performed in a specific order, these steps may include more or fewer steps, which may be performed in serial or in parallel. Also, an order of two or more steps may be changed, performance of two or more steps may overlap, and two or more steps may be combined into a single step. One or more of these steps may be modified to create different variations of embodiments. Well known steps or details may be omitted for simplicity.

With reference to FIGS. 5A-5Q, example process steps for manufacturing the semiconductor structure 400 are introduced. In step 501 (FIG. 5A), the transistor active areas (e.g., mesa 404(2)) and PD active areas (e.g., mesa 404(1)) are defined and patterned on substrate 402 by standard shallow trench isolation (STI) processes. In step 502 (FIG. 5B), PD active areas (e.g., mesa 404(1)) are opened and may be optionally recessed (e.g., for step height compensation). The upper region of the mesa 404(1) is then doped to one electrical polarity via ion implantation, thereby forming the bottom doped layer 411 for PD 410. In step 503 (FIG. 5C), dielectric material 405 (e.g., oxide) is deposited on the wafer, covering the devices, and then the wafer is planarized (e.g., by using chemical-mechanical polishing (CMP) processes). Preferably, the polishing process should stop on the relatively higher transistor mesas(e.g., mesa 404(2)), leaving the PD active areas (e.g., mesa 404(1)) remain protected by dielectric 405 during the following transistor fabrication steps.

In step 504 (FIG. 5D), components for front-end-of-line (FEOL) transistors (e.g., transistor 420) are formed on top of their respective mesa active areas (e.g., mesa 404(2)). In step 505 (FIG. 5E), MOL dielectric 407 is deposited to cover the transistors on the wafer, and then the wafer is planarized. In step 506 (FIG. 5F), transistor contact vias 430 are formed with standard MOL refractory metal (e.g., tungsten).

In step 507 (FIG. 5G), dielectric material 409 is deposited to fully cover and protect the MOL metals. In step 508 (FIG. 5H), the dielectric layer on top of the PD active areas (e.g., mesa 404(1)) is removed to expose (or "open") at least a part of the PD active areas. In some implementations, the area created by the opening may be larger than the final PD area to obtain a relatively flat surface on the top of the PD while removing one or more facet areas near the sidewall of the opening (e.g., facets 960 such as shown by FIG. 9B). As is described below, such facet areas can be formed during selective epitaxial growth processes. In step 509 (FIG. 5I), photosensitive material 413 is selectively deposited such that it is only or at least mostly deposited on the PD active area. Optionally, a buffered material 412 is deposited first before photosensitive material deposition. The buffered material 412 can be a material similar or equivalent to the substrate material. In step 510 (FIG. 5J), the upper region of the photosensitive layer is doped to the opposite polarity than the doped substrate layer to form the top doped region 414, thereby altogether forming a P-I-N photodetector structure 410. This top doped region 414 may be defined by, for example, ion implantation or in-situ doping during the epitaxy processes.

In step 511 (FIG. 5K), a passivation layer 415 is selectively deposited such that it is only deposited on the photosensitive material 413. In other implementations, the layer 415 can be formed by first depositing a blanket passivation layer and then being patterned with lithography and dry etching processes, leaving this passivation layer 415 only above the photosensitive material 413. In yet another implementation, the layer 414 can be formed after the passivation layer formation. A PD hard mask layer 409 is then deposited over the wafer. The hard mask layer 409 can be used for patterning photodetector mesas as well as the CMP or etch back stopper at the interlayer dielectric layer planarization stage.

In step 512 (FIG. 5L), photodetector mesas are patterned with typical lithography and dry etching processes. In some embodiments, there may be residual photosensitive material left nearby the oxide sidewall, forming rings 416, when using this patterning scheme, as shown in FIG. 5L. In step 513 (FIG. 5M), passivation spacer 417 is then formed at the sidewall of the PD mesa 404(1). According to some implementations of this process scheme, the sidewall spacer 417 can be formed next to the photosensitive ring 417 near the oxide edge as well. In step 514 (FIG. 5N), interlayer dielectric 491 is deposited to fill up the recessed area formed by the previous etching process. Planarization is then applied via etch back or CMP, which is to stop at the PD hard mask 409. In step 515 (FIG. 5O), another dielectric layer 493 can be deposited on the top of the wafer afterwards to ensure uniform dielectric thickness above the PD mesas across the wafer for optical purpose. In some implementations, one or more portions of step 512 through step 514 can be skipped, and step 515 can be performed immediately after the top passivation layer formation (step 512).

In step 516 (FIG. 5P), openings 431 are opened for building the first back-end-of-line metal layer (M1) contact vias. Specifically, the openings in the PD area are to form the PD's contact vias 440. Notably, the openings in transistor area can form additional contact vias that connect the already formed MOL contact vias 430 and/or serve as local interconnects for inter-transistor signal transfer. In one or more examples, in order to create various contact depths for the two kinds of devices, the openings for the PDs are patterned separately from the openings for the transistors. The openings 431 are then filled with BEOL metal (e.g., copper) in step 517 (FIG. 5Q) by metal deposition, followed by CMP. In some implementations, silicide formation can be performed in PD fabrication during or before PD contact formation (e.g., step 516) to improve contact resistance, thereby improving device performance. The PD silicide formation process and the materials used may be different than the transistor silicide formation process.

Although not illustrated in FIG. 5P for simplicity, one or more liners may be deposited over openings 431 before the BEOL metal deposition. These liners function as diffusion barriers for the BEOL metals, such as copper or aluminum. Typical materials for the liners can include titanium (Ti), titanium nitride (TiN), titanium tungsten (TiW), tantalum (Ta), tantalum nitride (TaN), and so forth. The thickness of the liners is fabrication technology dependent but typically very thin; for example, for 65 nm technology nodes, the liners for the contact plugs may be about 2 to 10 nm thick. It is noted that, for purposes of discussion herein, especially with regard to the materials used for the contact plugs, these liners are not considered as any part of the contact plugs.

In one or more implementations, the photosensitive material 413 can be Ge. Example materials for the substrate 402 can be Si or SOI. The passivation layer 415 can be amorphous-Si, poly-crystalline Si, nitride, high-k dielectric, silicon dioxide ($SiO_2$), or any combination thereof. The passivation spacer 417 can be amorphous-Si, poly-crystalline Si, nitride, high-k dielectric, $SiO_2$, or any combination thereof. The material for the PD hard mask layer 409 can be nitride, and the material for the interlayer dielectric 491 can be $SiO_2$. The trench isolation dielectric can be $SiO_2$, and the transistors (e.g., transistor 420) can be silicon-based transistors. The photodetectors (e.g., PD 410) can be of a normal incidence type. The optical signal for the normal incidence type PD can be either incident from the top through the dielectric layer 493 or from the bottom through the substrate 402.

Multiple Absorption Layer Approach

Figure 6A:
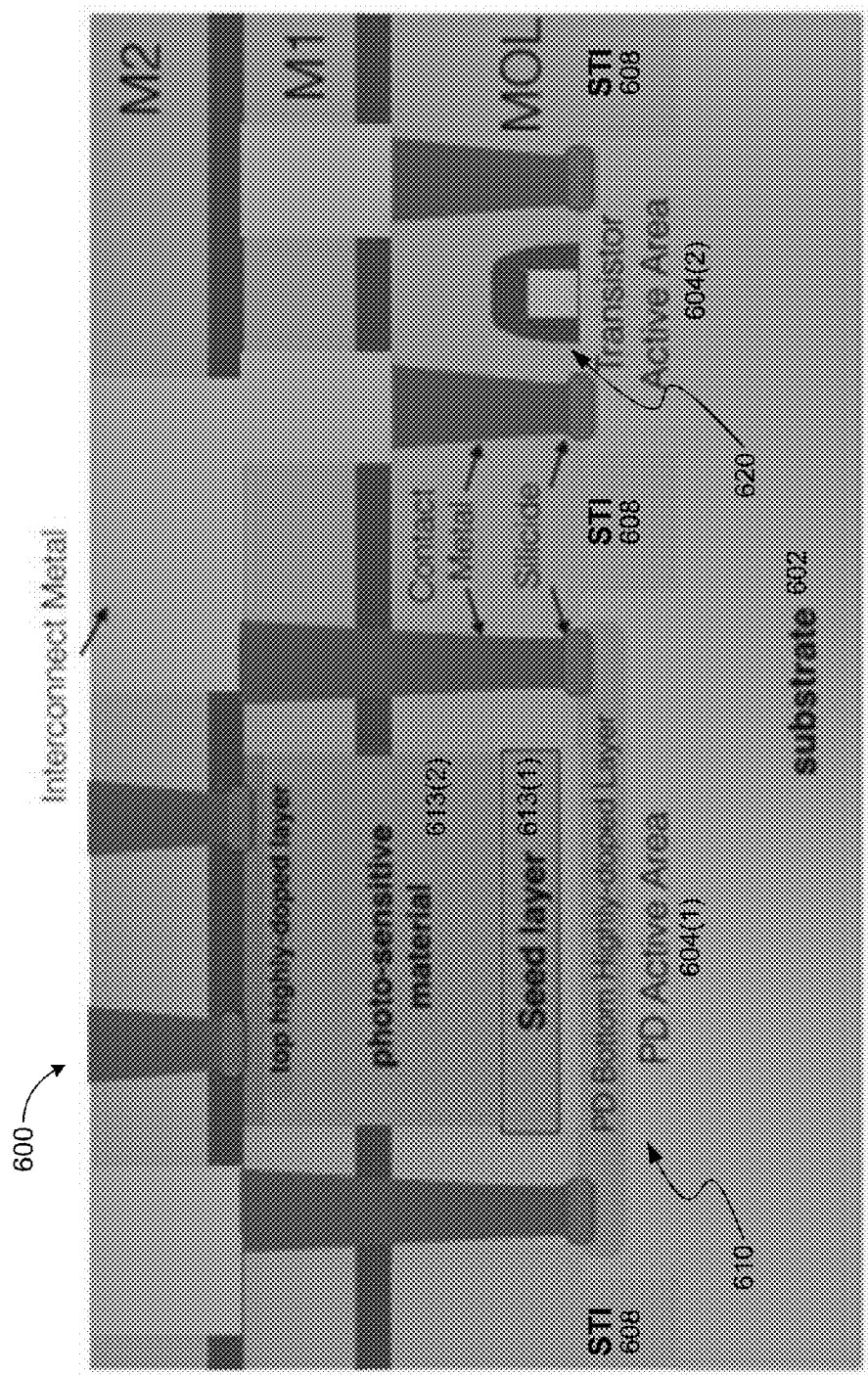
FIG. 6A is a cross-sectional view of yet another monolithic integrated semiconductor structure incorporating one or more aspects of the disclosed techniques.

FIG. 6A is a cross-sectional view of yet another monolithic integrated semiconductor structure 600 incorporating one or more aspects of the disclosed techniques. The structure 600 includes a PD device 610 and a transistor device 620. Both devices 610 and 620 are fabricated on substrate 602. Also shown in FIG. 6A are shallow trench isolation (STI) features 608, which are formed on the substrate 602 by performing etching before the devices 610 and 620 are fabricated, leaving mesas (e.g., mesa 604(1) and mesa 604(2)) on which devices 610 and 620 can be formed. Note that other forms of isolation techniques including, for example, bipolar junction isolation (e.g., by implanting opposite types of dopant at the transistor and PD boundary) may be used.

Recall that, among the issues associated with monolithic integration of PD and transistor, one issue is the extra thermal requirement that is placed on the CMOS FET devices when they are fabricated alongside with PD devices, exposing the FET devices to PD related processes. More specifically, high speed PDs are typically made out of photosensitive materials, such as Ge, GaAs, and InGaAs, that are not stable at certain CMOS FET's FEOL process temperatures. On the other hand, the epitaxial temperature of PD photosensitive materials is generally higher than the tolerance temperature of BEOL metals. These temperature constraint and step height limitation have made it very difficult to choose an appropriate insertion point for the photosensitive materials during the monolithic integration process.

Accordingly, one aspect of the techniques introduced here includes a modified photosensitive material formation approach that resolves or reduces both the temperature constraint and the step height limitation issues simultaneously. This particular approach achieves this by splitting the typical one-step photosensitive material heteroepitaxy process into multiple discrete epitaxial steps. Perhaps more importantly, it is observed that performing a homoepitaxial photosensitive material growing process can be more controllable than performing a heteroepitaxial one. More specifically, because of the general absence of lattice mismatch in a homoepitaxial process, the crystal nucleation involved in such process becomes easier and the resulting surface becomes smoother, requiring less annealing process to improve the crystal quality. Therefore, the thermal budget for performing a homoepitaxial photosensitive material growing process can be lower than that for performing a heteroepitaxial one. It may also be true that the photosensitive material has a lower melting point than that of the substrate material, which can place another process constraint limiting those designs that invoke a heteroepitaxial process of growing photosensitive materials on a silicon-based substrate. After separating the photosensitive material epitaxy process into multiple steps, only the first epitaxy step may be heteroepitaxial and all subsequent steps can become homoepitaxial, and therefore at least a part of the processes for fabricating the transistors can now be performed in between the multiple discrete epitaxial steps for growing the photosensitive material. This technique removes the conventional, inherent height and/or thermal limitations placed by the BEOL interconnect metal layers. Note that, for purposes of discussion herein, a substantially homoepitaxial process, such as growing germanium (Ge) on silicon-germanium (SiGe) alloy, is treated as a homoepitaxial process, because in such process of growing a substantially same material on the top of another can still result in similar benefits (e.g., lower processing temperature) to an homoeitaxial process introduced here.

At least in some embodiments, a first layer (also referred to herein as the "seed layer") of photosensitive material of the photodetector can be epitaxially grown on a semiconductor substrate, over an area where the photodetector is to be formed. After said seed layer of photosensitive material is grown, at least one layer of metallic contact plugs for the transistor can be formed. Then, after said metallic contact plugs for the transistor are formed, a subsequent layer of photosensitive material can be formed to complete the fabrication of the photodetector's light absorption region. The subsequent layer of photosensitive material can be formed on the top of the seed layer, such that the layers of photosensitive material can form the light absorption region for the photodetector. By avoiding a single step epitaxy process for the photosensitive material, this approach can advantageously reduce or minimize the issues of step height difference and additional thermal budget during monolithic integration of PD and transistor devices.

As illustrated in FIG. 6A, the photosensitive region 613 is separated into two layers 613(1) and 613(2). The two layers 613(2) and 613(2) are epitaxially grown in separated stages during the manufacturing process but jointly form a continuous photosensitive region. The first layer 613(1) is a relatively thin, seed layer that generally requires a high temperature surface cleaning process (e.g., 750-850 degrees Celsius, also known as "prebake") before epitaxial growth. This seed layer 613(1) can be inserted at a relatively early stage of the process. Because the seed layer 613(1) can be very thin (e.g., 10 nm), this seed layer growth would not face the step height issue as discussed above. As is discussed in detail below with respect to FIGS. 7A-7J, the seed layer 613(1) can then be covered by dielectric, and the fabrication process continues with FET building. The rest of the photosensitive material 613(2) is grown at a subsequent epitaxy step with a much flexible insertion point. As introduced above, since this subsequent growth is homogeneous epitaxy, no high temperature surface cleaning is necessary at the subsequent growth. The process temperature can be much lower than the first growth, and therefore the subsequent growth step can be inserted at a later part of the FET fabrication process. The final height of the PD is only limited by the insertion point of the subsequent growth, not the initial growth. In this way, the top surface of the light absorption region of the photodetector can be higher than the bottom of the metal interconnect layers for the transistor, which may be impossible in the traditional, single-step epitaxy process.

Figure 6B:
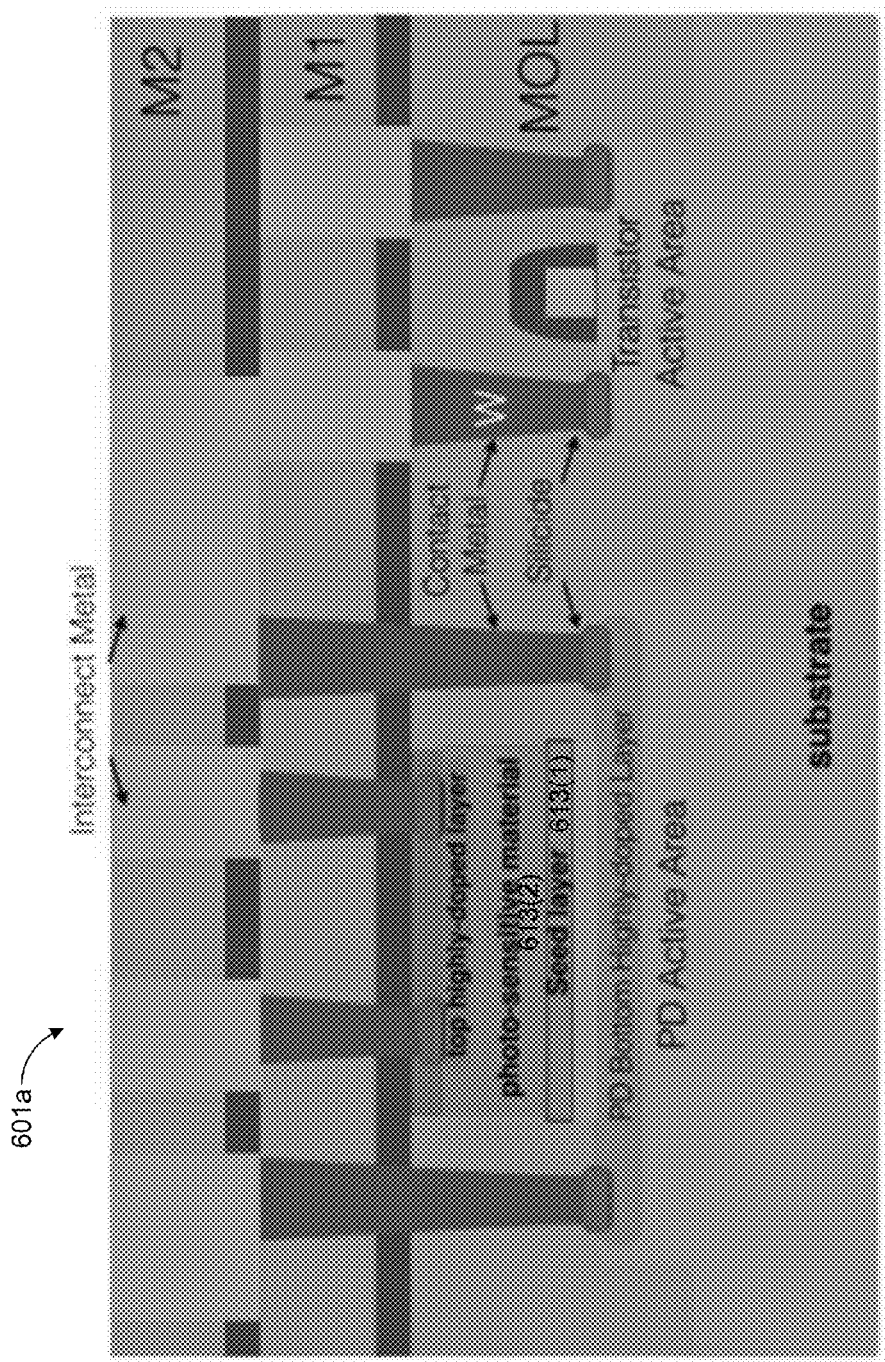
FIGS. 6B-6C are cross-sectional views of monolithic integrated semiconductor structures that are variants of the structure shown in FIG. 6A.
Figure 6C:
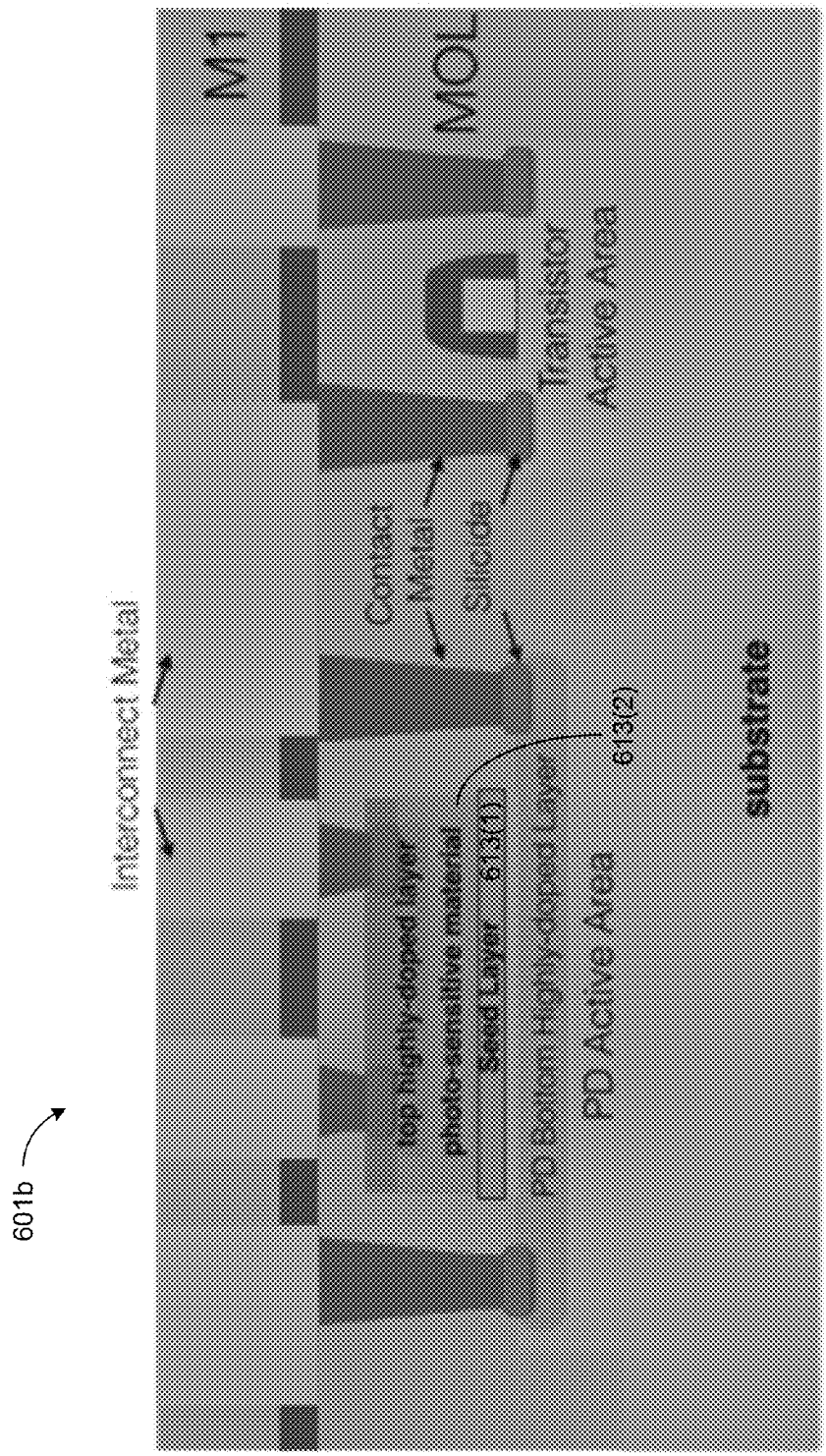
Figure 7A:
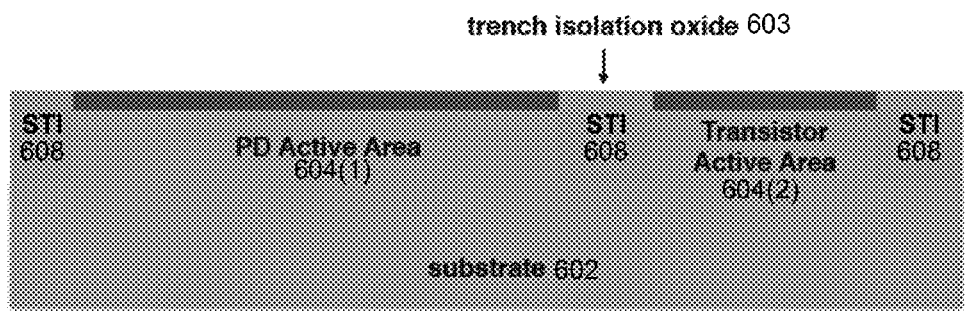
FIGS. 7A-7J are cross-sectional views showing various process steps for manufacturing the semiconductor structure of FIG. 6A in accordance with some embodiments.
Figure 7B:
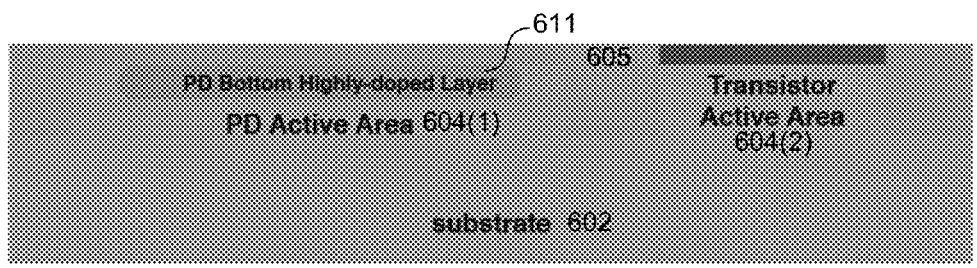
Figure 7C:
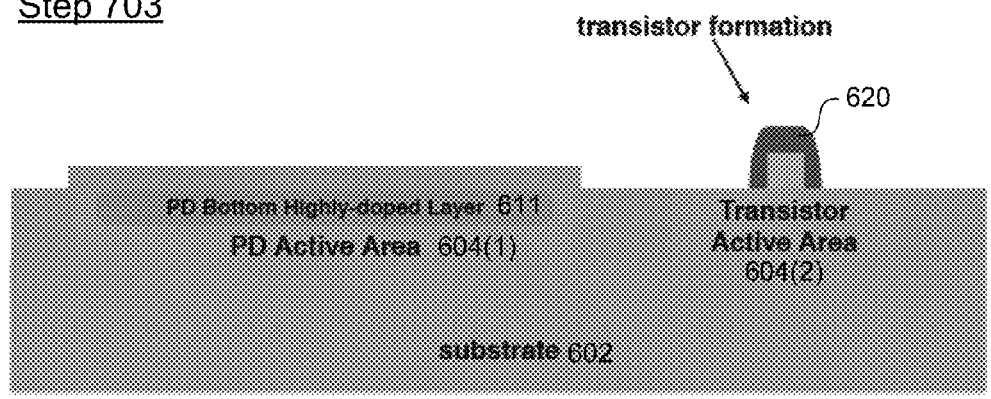
Figure 7D:
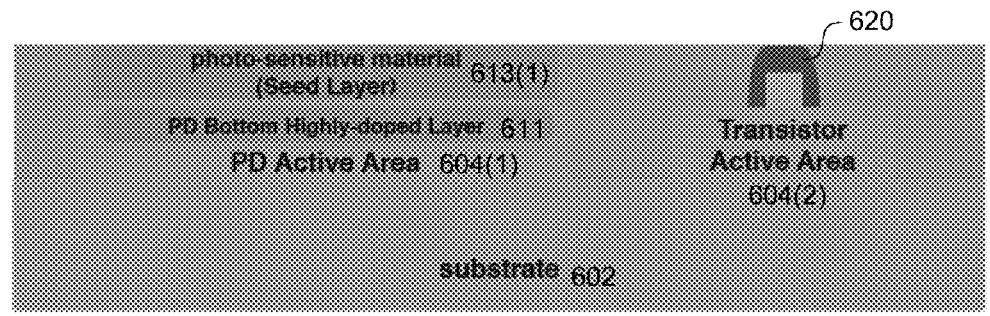
Figure 7E:
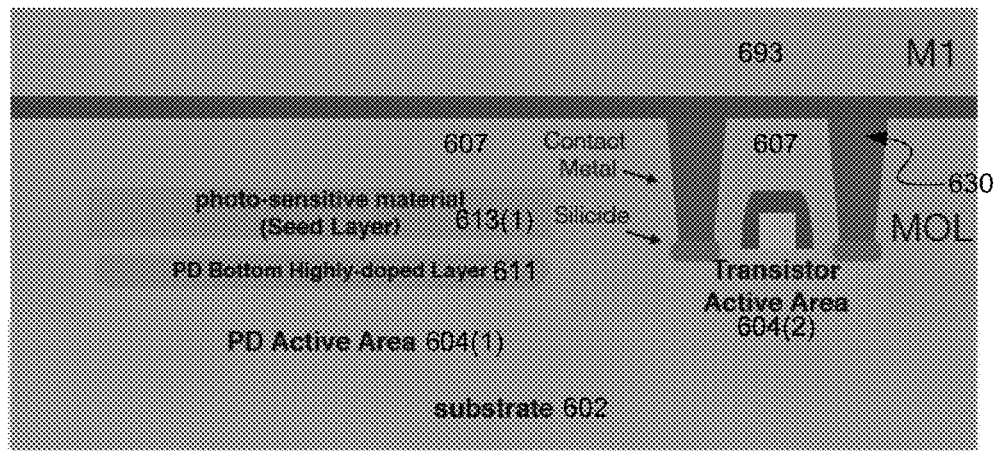
Figure 7F:
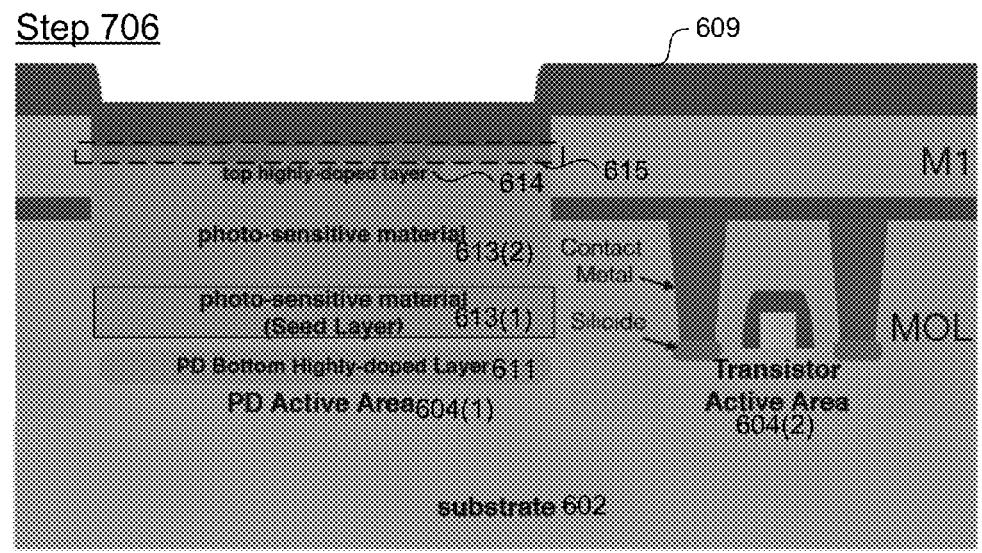
Figure 7G:
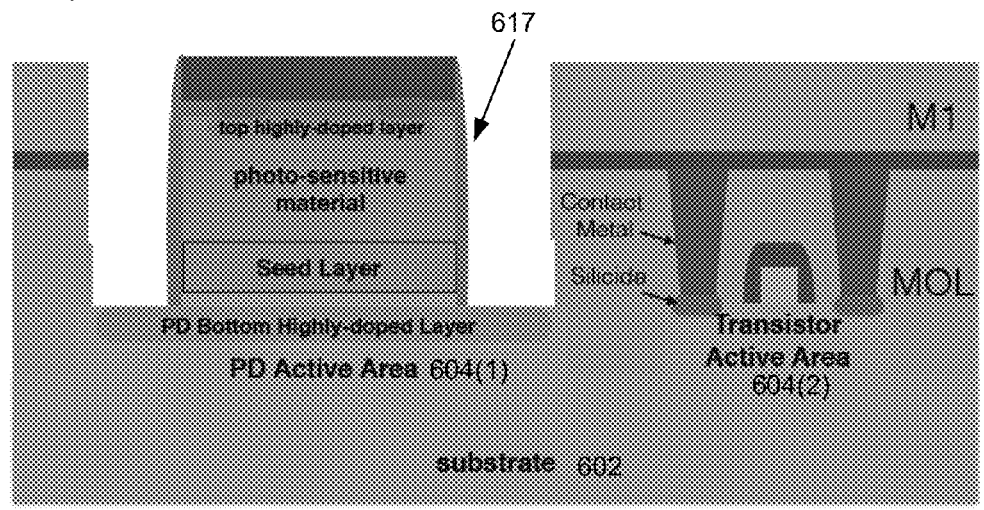
Figure 7H:
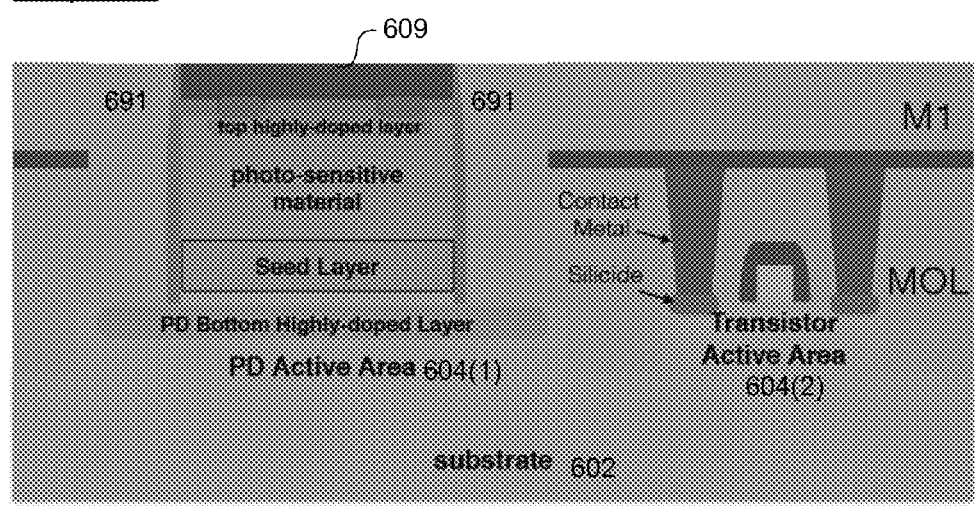
Figure 7I:
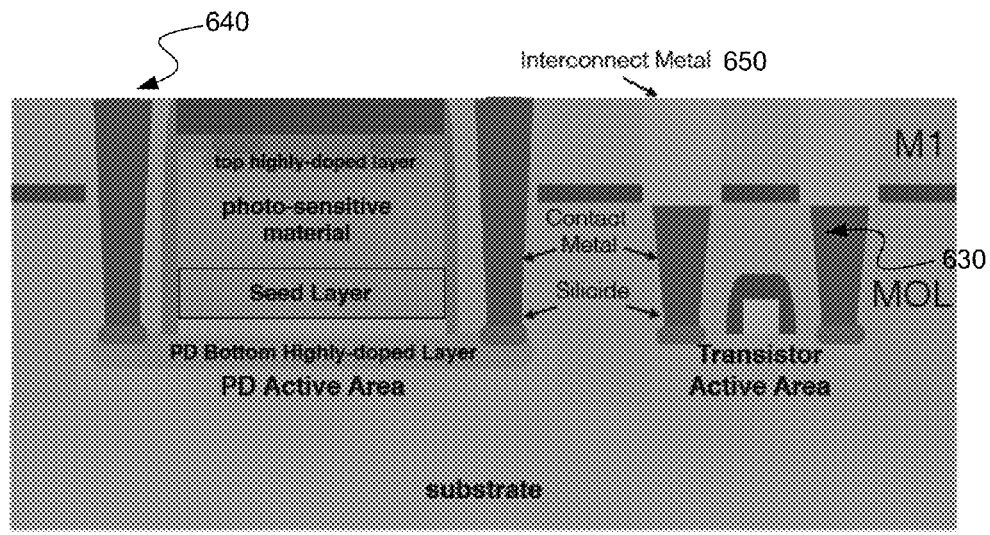
Figure 7J:
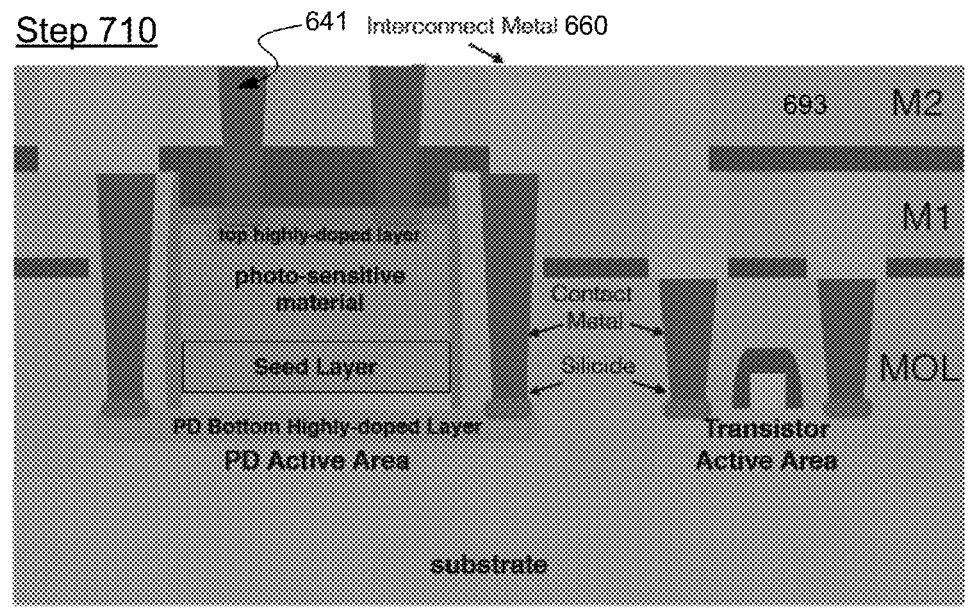

FIGS. 6A-6C demonstrate how different insertion point scenarios can result in different PD heights. In FIG. 6A, the insertion point is set after Backend-Of-Line (BEOL) Metal 1 (M1) dielectric layers are formed, and thus in structure 600, the PD height can be as high as the top surface of M1 dielectric layer. In comparison, in FIG. 6B, the insertion point is set after middle-of-line dielectric (MOL) layer is formed, and therefore in structure 601a, the PD height may be as tall as the MOL dielectric layer. in FIG. 6C, the insertion point is set before the MOL dialectic layer is formed, and therefore in structure 601b, the PD height is shorter than the MOL dielectric layer.

Note that, because this particular technique forms the photosensitive region at two or more different stages, the technique inherently requires separate lithography and patterning processes. Therefore, if without further processing afterwards, the sidewalls of the interface between the first seed layer and the subsequent growth layer are expected to have at least some physical discontinuity, notwithstanding both layers target the same lateral pattern. This discontinuity is because of imperfection of lithography alignment in real practice. That is to say, the light absorption region of the photodetector may exhibit a physical structure that has a sidewall misalignment (or a discontinuous sidewall), which is a manifestation of two or more separate material forming processes growing the same photosensitive material.

Additionally or alternatively, the photosensitive material can be patterned after the multi-step deposition, and in some embodiments, covered with another passivation layer. With this extra patterning step, the aforesaid physical discontinuity between first seed layer and second epitaxial layer may be removed.

In some embodiments, the photosensitive layer forming process can be separated into more than two steps. Also, using the introduced technique, the last epitaxial insertion point can be set later such that the PD height can become higher than at least M1, assuming that the last step of epitaxial growth and the following highly-doped layer formation process is BEOL tolerable.

Similar approach can also be applied on waveguide-based bulk-coupled PDs integrated with CMOS FETs. This approach is particularly beneficial when applied to waveguide-based PDs being integrated with advance technology node CMOS FETs because this scenario tends to be more sensitive to step height difference and thermal budgets. Note that a silicon-on-insulator (S01) substrate can be suitable for this application scenario because the integrated components may include silicon waveguides.

With this technique, the height of PDs can become taller than what is limited by conventional methods without causing FET performance penalty. Thus, this multiple step epitaxy approach can resolve or mitigate the step height difference issue.

FIGS. 7A-7J are cross-sectional views showing various process steps for manufacturing the semiconductor structure of FIG. 6A in accordance with some embodiments. Note that, while these process steps that are described and/or depicted as performed in a specific order, these steps may include more or fewer steps, which may be performed in serial or in parallel. Also, an order of two or more steps may be changed, performance of two or more steps may overlap, and two or more steps may be combined into a single step. One or more of these steps may be modified to create different variations of embodiments. Well known steps or details may be omitted for simplicity.

With reference to FIGS. 7A-7J, example process steps for manufacturing the semiconductor structure 600 are introduced. In step 701 (FIG. 7A), the FET active area 604(2) and the PD active area 604(1) are defined and patterned on substrate 602 by, for example, using a standard shallow trench isolation (STI) process. Such process fills isolation material 603 (e.g., oxide) into the trenches to form STI features 608. In step 702 (FIG. 7B), PD active area 604(1) are first opened and then doped to one electrical polarity via ion implantation, thereby forming the bottom doped layer 611 for PD 610. Then, area 604(1) is covered again with dielectric material 605.

In step 703 (FIG. 7C), front-end-of-line (FEOL) transistor components 620 are formed on top of the transistor active area 604(2) while PD active area 604(1) are covered with the dielectric layer. In step 704 (FIG. 7D), the PD active area 604(1) is opened again, and the seed layer 613(1) of photosensitive material is heteroepitaxially grown on the PD active areas. The thickness of the seed layer 613(1) can be in the range of 5 nm to 500 nm, depending on the technology of the FET nodes being integrated. In step 705 (FIG. 7E), standard MOL dielectric 607 is deposited over the wafer to cover both types of devices. Then, the wafer is planarized, which is followed by FETs contact metal formation to form FET contact vias 630. Thereafter, BEOL M1 dielectric layer 693 is deposited over the MOL layer.

In step 706 (FIG. 7F), the dielectric layers on top of PD active area 604(1) are opened, and a subsequent photosensitive material epitaxial growth is performed to form the second photosensitive layer 613(2). Then, the upper region of the photosensitive layer 613 is doped to the opposite polarity than the doped substrate layer by ion implant or in-situ doping to form the top doped layer 614, thereby altogether forming a P-I-N photodetector structure 610. Next, the top passivation layer 615 is selectively deposited on the photosensitive material 613, and a hard mask layer 609 is then deposited over the wafer. In other implementations, the layer 615 can be formed by first depositing a blanket passivation layer and then being patterned with lithography and dry etching processes, leaving this passivation layer 615 only above the photosensitive material 613. In yet another implementation, the layer 614 can be formed after the passivation layer formation.

In step 707 (FIG. 7G), the PD mesa 604(1) is patterned and then covered with passivation spacer 617 on the sidewalls. In step 708 (FIG. 7H), the gaps between PD mesa 604(1) and dielectric layers (which are resulted from previous patterning) are filled by another dielectric deposition 691. Then, a planarization process is performed, which stops on the PD hard mask 609. In step 709 (FIG. 7I), the PD bottom metal contacts 640 are formed, followed by M1 metal interconnect formation 650. In Step 710, M2 dielectric layers 693 are deposited, followed by PD top metal contacts formation 641 and M2 metal interconnect formation 660. Depending on the design, interconnect metal formation can be used for forming additional contact vias and/or for communication among devices. In some implementations, parts of step 706 through step 708 can be skipped, and step 709 can be performed immediately after the top passivation layer formation (step 706). In some implementations, the PD bottom contact formation (step 709) and top contact formation (step 710) can be performed on the same BEOL dielectric layer but in separate patterning processes due to their different end points. In some implementations, silicide formation can be introduced in PD fabrication during or before PD contact formation (e.g., steps 709 and 710) to improve contact resistance, thereby improving device performance.

In one or more implementations, the photosensitive material 613 can be Ge. Example materials for the substrate 602 can be Si or SOI The passivation layer 615 can be amorphous-Si, poly-crystalline Si, nitride, high-k dielectric (e.g., aluminum oxide (Al$_2$O$_3$), hafnium oxide (HfO$_2$)), SiO$_2$, or any combination thereof. The passivation spacer 617 can be amorphous-Si, poly-crystalline Si, nitride, high-k dielectric (e.g., Al$_2$O$_3$, HfO$_2$), SiO$_2$, or any combination thereof. The material for the PD hard mask layer 609 can be nitride, and the material for the interlayer dielectric 691 can be SiO$_2$. The trench isolation dielectric 603 can be SiO$_2$, and the transistors (e.g., transistor 620) can be silicon-based transistors. The photodetectors (e.g., PD 610) can be of a normal incidence type in which the optical signal can either incident from the top through the dielectric layer 693 or from the bottom through the substrate 602.

Recited here is an alternative description of the multiple absorption layer approach introduced above with regard to FIGS. 7A-7J. This alternative description is for providing additional completeness and for further enabling the understanding of various benefits in practicing such approach.

Some embodiments of the multiple absorption layer approach include a method for fabricating a photodetector and a transistor on the same semiconductor substrate, with silicon as the top surface of the substrate. The method generally includes 5 steps. Step (1): forming at least a part of the transistor before its contact via formation. Step (2): forming the first light absorption layer of the photodetector on a first selected area on the top of the substrate. Step (3): forming an isolation layer on the top of the first light absorption layer. Step (4): removing a part of the isolation layer to expose a second selected area of the first light absorption layer. The second selected area is at least partially overlapping with the first selected area. And, step (5): forming a second light absorption layer directly on the top of the exposed first light absorption layer. The second light absorption layer can be formed such that the two layers form a single light absorption region for the photodetector. As such, the photodetector can be formed with a thicker combined absorption layer for higher quantum efficiency and higher bandwidth, without being limited by the step height and thermal constraint during traditional fabrication processes. Optionally, additional light absorption layers can be formed after step (5) by repeating step (3), step (4), and step (5).

The single light absorption region may have a sidewall misalignment between the first selected area and the second selected area. The sidewall misalignment may be an intentional or unintentional result of separate lithography and etching steps. Also, as a result of the above approach, in some embodiments, a top surface of the second light absorption layer is higher than the top surface of the contact vias for the transistor.

According to one or more implementations, the first light absorption and second light absorption layers both include germanium. A first prebake can be performed before the step (2) to clean up the heterogeneous interface. Similarly, a second prebake can be performed before the step (5) to clean up the homogeneous interface. A higher temperature may be used during the first prebake than the second prebake since the first prebake is performed without involving any MOL and BEOL processes. Notably, a higher prebake temperature may be preferable for heterogeneously growing Ge (e.g., on Si) than homogeneously growing Ge (e.g., on Ge), because the naturally formed passivation layer on Si surface during fabrication processes may require higher temperature to remove than removing the naturally formed passivation layer (e.g., GeO or GeO$_2$) on Ge surface.

In some embodiments, the first light absorption layer includes germanium, and a prebake temperature above 700 degrees Celsius is performed before step (2) to clean up the interface between germanium and silicon. In some embodiments, the second light absorption layer includes germanium, and a prebake temperature lower than 700 degrees Celsius is performed before step (5) to clean up the homogeneous interface.

Additionally, the first selected area can be smaller than the second selected area such that any fabrication defect can be at least partially confined in the first selected area. In other embodiments where defects are not a primary concern, the first selected area is not smaller than the second selected area.

In a number of examples, a relative height difference between the top surfaces of photodetector and transistor active areas is formed before step (1). One or more embodiments provide that the photodetector and transistor share at least one doping region on the substrate. Further, in some examples, the combined height of the light absorption region (from the multiple layers) is higher than the bottom surface of first metal interconnect layer for the transistor.

In variations, before step (2), a spacer can be formed on the sidewall of the first selected area such that the sidewall of the first absorption layer can be passivated by the spacer. The spacer can be intrinsic amorphous silicon, doped amorphous silicon, oxide, nitride, and/or high-k dielectric materials, such that a selective epitaxial growth can be used during step (2) to have layers primarily grown only on the exposed first selected area instead of the spacer.

Additionally or alternatively, before step (5), a spacer can be formed on the sidewall of the second selected area such that the sidewall of the second absorption layer can be passivated by the spacer. The spacer can also be intrinsic amorphous silicon, doped amorphous silicon, oxide, nitride, and/or high-k dielectric materials, such that a selective epitaxial growth can be used during step (5) to have layers primarily grown only on the exposed second selected area instead of the spacer or the passivation layer.

Note that, according to some aspects, the remaining active areas of the transistor are formed before step (4), leaving contact vias for the photodetector to be formed after step (4). For example, the via contact formation for the photodetector can be performed during the formation of metal interconnect layers. In some cases, The photodetector's contact vias are entirely made of non-refractory materials (e.g., BEOL metals such as aluminum or copper) from metal interconnect layers.

Fill Shapes

Figure 8A:
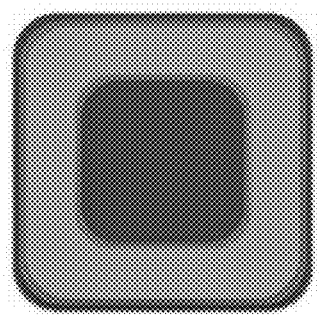
FIGS. 8A-8B are a top view and a cross-sectional view of a monolithic integrated semiconductor structure including different sizes of fill shapes for PD and transistor.
Figure 8A:
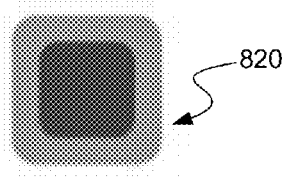
Figure 8B:
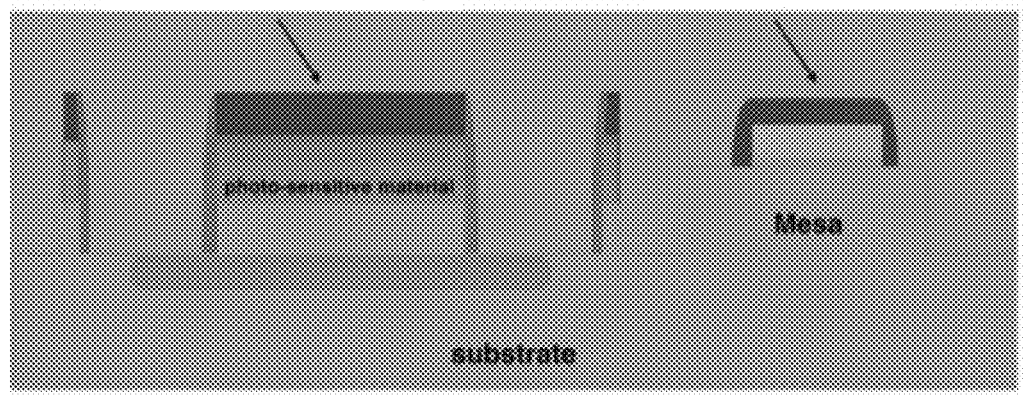

FIGS. 8A-8B are a top view and a cross-sectional view of a monolithic integrated semiconductor structure including different sizes of fill shapes for PD and transistor, and more specifically, a fill shape 810 that is about a size of a PD, and a fill shape 820 that is about a size of a transistor.

In particular, it is observed that, with the monolithic integration of PD and transistor, two kinds of devices that are much different in size (e.g., a transistor being less than half of the size of a PD) are fabricated on the same wafer. Further, when the wafer is manufactured, there are a number of fabrication processes that involve material growth (e.g., photosensitive material epitaxy) and material removal (e.g., CMP planarization, or reactive ion etching), an ideal situation of which should exert a uniform loading on the wafer. However, in reality, the results of these processes are affected by the pattern already fabricated on the wafer. Because the different sizes of PD and transistor, the loading on some portions of the wafer may be larger than some other portions, which may adversely impact the yield.

Accordingly, in one aspect of the disclosure, the device layout is defined such that, besides the photodetector and transistor active areas, the layout can include at least two different types of fill shapes—photodetector fill shapes 810 and transistor fill shapes 820. As illustrated in FIG. 8B, each type of fill shape carries the same process flow as its corresponding active device, except that it is not electrically connected to any other device, thereby acting as a dummy device.

The main purpose of inserting two different fill shapes on the wafer is to promote uniform process loading across the wafer for both types of devices. As such, according to at least some embodiments, each type of fill shape should reach substantially the same height as their respective active devices in order to achieve the purposes of uniform loading. For example, the example fill shapes 810 and 820 are based on the fabrication process flow discussed above with respect to FIG. 2, which has different mesa heights for PDs and transistors. In such example, the transistor fill shape 820 should be formed on a surface (e.g., mesa 404(2)) that is at the same height as other "real" transistors. Similarly, the photodetector fill shape 810 in such example should be formed on a surface (e.g., mesa 404(1) that is at the same height as other "real" photodetectors. Depending on the embodiment, the size and density of the shapes can be different. In some examples, the photodetector fill shapes can be larger and less dense.

Applicable Photodetector Formation Methodology

Figure 9A:
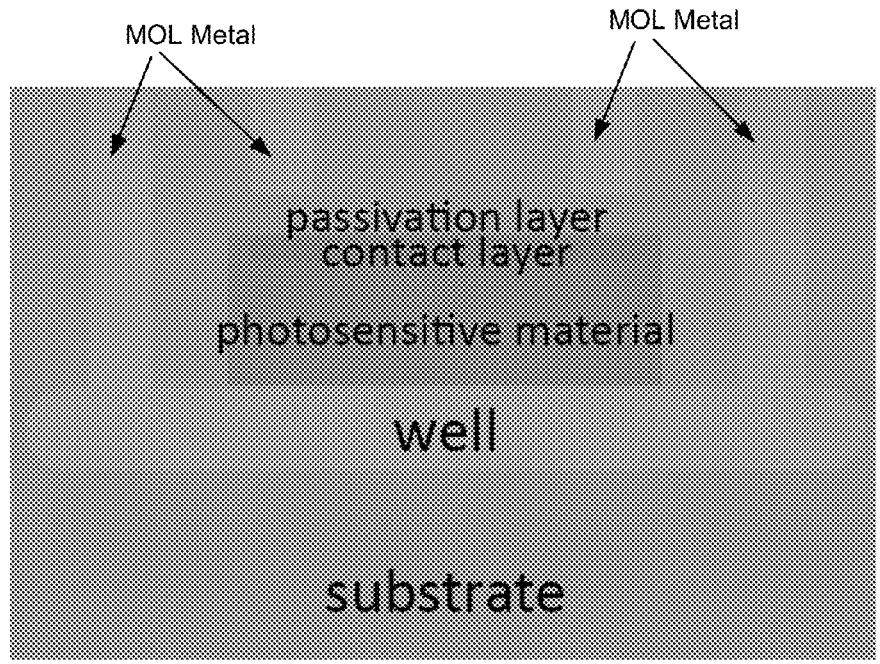
FIGS. 9A and 9B are cross-section views of additional photodetector formation methodologies to which one or more aspects of the monolithic integration techniques introduced here may be applied.
Figure 9B:
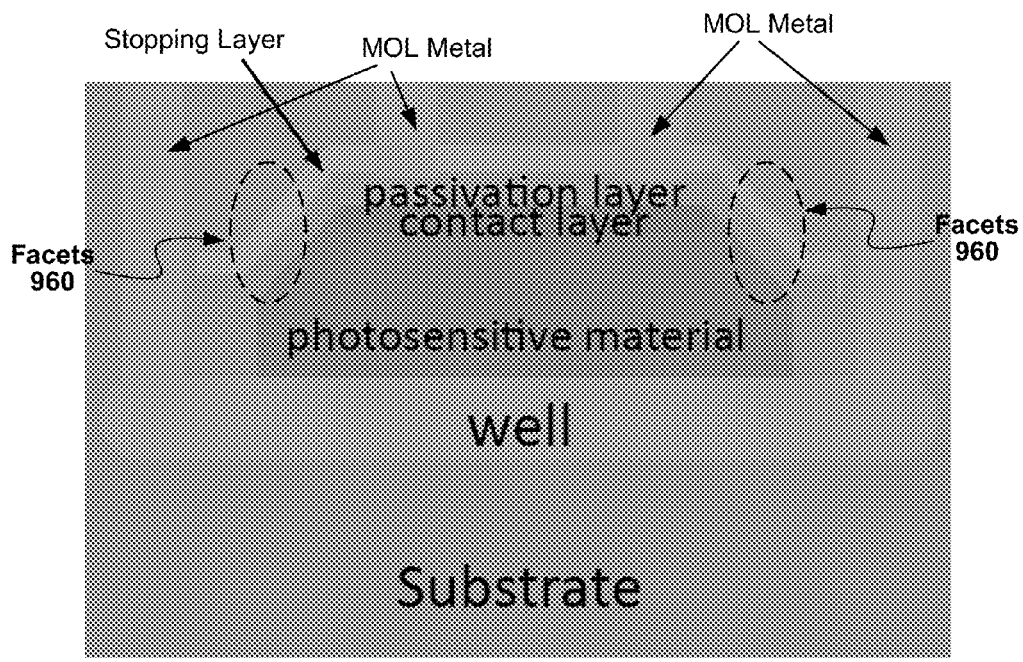

FIGS. 9A and 9B are cross-section views of additional photodetector (PD) formation methodologies to which one or more aspects of the monolithic integration techniques introduced here may be applied. The example PD formation methodology introduced above generally involves selective epitaxy, followed by PD active area patterning (e.g., via lithography and dry etch). Nonetheless, the monolithic integration techniques introduced here can be suitable for other types of PD formation methodologies as well. At least two additional PD formation methodologies are applicable, which are respectively shown in FIG. 9A and FIG. 9B.

In FIG. 9A, the selective growth area is directly used as the PD active area, and therefore no additional PD active area patterning is required after the selective epitaxy process. Instead, a CMP process can be performed to planarize the surface. Then, a passivation layer is deposited on the top of the photosensitive material to cover the photosensitive material's top surface. One of the benefits of this formation methodology is to reduce the process complexity associated with PD active area patterning and the following gap filling/planarization step.

Another applicable PD formation methodology is shown in FIG. 9B. In this formation methodology, the selective growth area is also directly used as the PD active area. The difference between the methodologies in FIG. 9A and FIG. 9B lies in the post-epitaxy CMP process. In FIG. 9B, the CMP process in FIG. 9A is skipped, and the photosensitive material still retains its facet sidewall. The benefit of this methodology is to avoid the CMP dishing issue that may be present in the methodology of FIG. 9A, especially when such CMP process is performed for relatively large area PDs (e.g., diameter larger than 10 µm) where surface dishing can form during the CMP process. Note that, in some examples of this CMP-less formation process, the selective growth area may also be larger than the PD active area, and an etching process similar to what is shown in FIG.5L can be performed to remove the facets on the sides.

Conclusion

Unless contrary to physical possibility, it is envisioned that (i) the methods/steps described above may be performed in any sequence and/or in any combination, and that (ii) the components of respective embodiments may be combined in any manner.

Note that any and all of the embodiments described above can be combined with each other, except to the extent that it may be stated otherwise above or to the extent that any such embodiments might be mutually exclusive in function and/or structure.

Although the present disclosure has been described with reference to specific exemplary embodiments, it will be recognized that the invention is not limited to the embodiments described, but can be practiced with modification and alteration within the spirit and scope of the appended claims. For example, while two contact vias are shown for each doped area of one or more structures in this disclosure, a single continuous contact via or a ring/spur shaped via can be formed for the doped areas to extract photo-generated carriers from the light absorption region. Accordingly, the specification and drawings are to be regarded in an illustrative sense rather than a restrictive sense.

Examples of Certain Embodiments

To summarize, therefore, some example implementations of the disclosed techniques introduced herein are as recited in the following numbered clauses:

(A) for the mesa height adjustment approach during STI formation:

1. A method for fabricating a photodetector and a transistor on a same semiconductor substrate, the method comprising:
   forming, on a semiconductor substrate, a structure having two mesas, one mesa for the transistor and one mesa for the photodetector, wherein a mesa groove between the two mesas forms an isolation trench, and wherein the two mesas are of a same height;
   adjusting a relative height between the mesa for the photodetector and the mesa for the transistor; and
   forming the transistor and the photodetector on respective mesas.

2. The method of clause 1, wherein said adjusting the relative height comprises:
   reducing a height of the mesa for the photodetector until a top surface of the mesa for the photodetector is lower than a top surface of the mesa for the transistor but higher than a bottom surface of the isolation trench.

3. The method of clause 2, wherein said reducing the height of the mesa for the photodetector comprises:
   depositing a protection layer over the mesa for the transistor for protection against etching; and
   etching the semiconductor substrate to remove substrate material in the mesa for the photodetector to reduce the height of the mesa for the photodetector.

4. The method of clause 1, wherein said adjusting the relative height comprises: increasing a height of the mesa for the transistor by epitaxial growth.

5. The method of clause 1, wherein said forming the structure having two mesas comprises:
   depositing a stopping layer, with patterns defining the two mesas, over the semiconductor substrate; and
   etching the semiconductor substrate to create the structure having the two mesas.

6. The method of clause 1, further comprising:
   depositing isolation oxide in the mesa groove to form the isolation trench.

7. The method of clause 6, wherein the isolation dielectric material comprises silicon oxide or silicon nitride or a combination thereof.

8. The method of clause 1, further comprising:
forming, on the semiconductor substrate, dummy fill shapes of at least two sizes at suitable locations for uniform process loading across a wafer during a subsequent epitaxial growth or a subsequent material removal process, wherein one size of the dummy fill shape dedicated for the transistor, and wherein another size of the dummy fill shape dedicated for the photodetector.

9. The method of clause 8, wherein the subsequent material removal process includes at least one of: a chemical mechanical polishing process, or a reactive ion etching process.

10. The method of clause 1, wherein the photodetector is a silicon-based germanium photodetector, and wherein the transistor is a silicon-based metal-oxide-semiconductor field-effect transistor (MOSFET).

11. The method of clause 1, wherein the photodetector is a normal incidence type.

12. A device comprising:
a semiconductor substrate including a first surface, a second surface, and a third surface;
a semiconductor transistor formed on the second surface higher than the first surface; and
a semiconductor photodetector formed on the third surface higher than the first surface but lower than the second surface, wherein the first surface, being lower than both the second and the third surfaces, forms an isolation trench between the semiconductor photodetector and semiconductor transistor.

13. The device of clause 12, wherein a resulting height of the semiconductor photodetector is lower than a bottom surface of a lowest layer of metal interconnects for the semiconductor transistor.

14. The device of clause 12, wherein the semiconductor photodetector is formed at a different horizontal location on said semiconductor substrate than the semiconductor transistor.

15. The device of clause 12, wherein the semiconductor photodetector and the semiconductor transistor are formed on two separate mesas, one mesa for the transistor and one mesa for the photodetector, and wherein a mesa groove between the two mesas forms an isolation trench.

16. The device of clause 15, wherein the isolation trench is filled by at least one or more of: oxide-based dielectric materials, or nitride-based dielectric materials.

17. The device of clause 12, wherein the photodetector includes a P-I-N structure having a highly-doped p-type semiconductor region, a highly-doped n-type semiconductor region, and an intrinsic photosensitive semiconductor region located between said p-type and n-type semiconductor regions.

18. The device of clause 17, wherein semiconductor materials used in at least a part of the P-I-N structure are different from semiconductor substrate material.

19. The device of clause 17, wherein the intrinsic photosensitive semiconductor region comprises a stack of semiconductor materials including substrate semiconductor material with a first dielectric constant and a photosensitive material with a second dielectric constant, the second dielectric constant higher than the first dielectric constant.

20. The device of clause 19, wherein a thickness ratio between the substrate semiconductor material and other semiconductor materials in the intrinsic photosensitive semiconductor region combined is greater than 1 to 5.

21. The device of clause 12, further comprising:
a select number of dummy fill shapes about a size of the transistor, wherein the dummy fill shapes of the size of the transistor are formed on a surface that is at a same height as the second surface.

22. The device of clause 12, further comprising:
a select number of dummy fill shapes about a size of the photodetector, wherein the dummy fill shapes of the size of the photodetector are formed on a surface that is at the same height as the third surface.

23. The device of clause 12, wherein the photodetector is a silicon-based germanium photodetector, and wherein the transistor is a silicon-based metal-oxide-semiconductor field-effect transistor (MOSFET).

24. The device of clause 12, wherein the photodetector includes a mirror structure for reducing a thickness of a light absorption region of the photodetector.

(B) for the transistor via first approach:

1. A method for fabricating a photodetector and a transistor on a same semiconductor substrate, the method comprising:
(1) during a front-end-of-line (FEOL) fabrication stage, forming the transistor on a semiconductor substrate;
(2) during a middle-of-line (MOL) fabrication stage and before the photodetector is formed on the semiconductor substrate, forming contact plugs for the transistor by using refractory materials;
(3) forming the photodetector on the semiconductor substrate; and
(4) only during an back-end-of-line (BEOL) fabrication stage, forming contact plugs for the photodetector.

2. The method of clause 1, wherein said contact plugs for the photodetector are formed by using non-refractory materials.

3. The method of clause 1, further comprising:
during said BEOL fabrication stage, forming additional contact plugs on said contact plugs for the transistor, wherein the additional contact plugs for the transistor are to (a) be electrically connected to said formed contact plugs for the transistor and (b) reach a same height as the contact plugs for the photodetector.

4. The method of clause 3, wherein a portion of the additional contact plugs is configured as interconnects that provide inter-device signal transfer for the transistor.

5. The method of clause 1, wherein said forming contact plugs for the photodetector comprises:
in a first step during the BEOL fabrication stage, forming a first set of contact plugs for the photodetector by using a first metal material; and
in a subsequent step during the BEOL fabrication stage, forming a second set of contact plugs for the photodetector by using a second metal material,
wherein the first and second sets of contact plugs are for different doped regions of the photodetector.

6. The method of clause 1, further comprising:
before said forming the transistor, forming a structure having a mesa for the transistor and a mesa for the photodetector; and
adjusting a relative height between the mesa for the photodetector and the mesa for the transistor until a top surface of the mesa for the photodetector is lower than a top surface of the mesa for the transistor.

7. The method of clause 1, wherein said contact plugs for the transistor are the first metal directly contacting the formed transistor, and wherein said contact plugs for the transistor are formed in arrays of pillars or bars.

8. The method of clause 1, wherein said MOL stage further comprises:
depositing a dielectric layer that is the first dielectric layer covering the transistor.
9. The method of clause 1, wherein said contact plugs for the transistor are formed to be entirely below a bottom surface of a first interconnect layer for the transistor and are positioned to be electrically coupled with at least one of: the transistor's gate area, the transistor's source area, or the transistor's drain area.
10. The method of clause 9, wherein a first group of said contact plugs for the photodetector are formed to be entirely below a bottom surface of a first interconnect layer for the photodetector and are positioned to be electrically coupled with a first doped region of the photodetector.
11. The method of clause 10, wherein a second group of said contact plugs for the photodetector are formed to be at least partially above the bottom surface of the first interconnect layer for the transistor and are positioned to be electrically coupled with a second doped region of the photodetector, the second doped region having a different polarity than the first doped region.
12. The method of clause 1, wherein said BEOL stage further comprises:
sequentially forming a number of interconnect layers above layers formed during the MOL stage.
13. The method of clause 1, wherein said forming contact plugs for the photodetector comprises:
forming contact plugs for the photodetector's P and N regions by using different BEOL metals during the BEOL stage
14. The method of clause 1, wherein materials used to form said contact plugs for the transistor comprise at least one of: tungsten, titanium, or titanium nitride.
15. The method of clause 1, wherein materials used to form said contact plugs for the photodetector comprise interconnect metals including at least one of: copper or aluminum.
16. A semiconductor device comprising:
a semiconductor substrate;
a transistor formed on said semiconductor substrate;
a photodetector formed on said semiconductor substrate;
contact plugs for the transistor, wherein said contact plugs for the transistor have at least two portions that are formed from separate semiconductor material forming processes, and wherein a sidewall of said contact plugs for the transistor includes a physical misalignment, which is a manifestation of said separate semiconductor material forming processes; and
contact plugs for the photodetector, wherein said contact plugs for the photodetector are formed from a single semiconductor material forming process.
17. The device of clause 16, wherein a top surface of said contact plugs for the photodetector is higher than the physical misalignment on the sidewall of said contact plugs for the transistor.
18. The device of clause 16, wherein the contact plugs for the transistor include refractory materials formed during a middle-of-line (MOL) fabrication stage
19. The device of clause 16, wherein the contact plugs for the photodetector are entirely made of non-refractory materials from metal interconnect layers formed during a back-end-of-line (BEOL) fabrication stage, without any refractory materials from a middle-of-line (MOL) fabrication stage.
20. The device of clause 16, wherein the transistor and the photodetector are formed at a different height on said semiconductor substrate.
21. The device of clause 16, wherein, when measured from the semiconductor substrate, the photodetector is formed on a first surface that is closer to the semiconductor substrate than a second surface on which the transistor is formed.
22. The device of clause 16, wherein a lower portion of the at least two portions of said contact plugs for the transistor is formed to be entirely below a bottom surface of a first interconnect layer for the transistor and are positioned to be electrically coupled and directly in physical contact with at least one of: the transistor's gate area, the transistor's source area, or the transistor's drain area.
23. The device of clause 22, wherein a first group of said contact plugs for the photodetector are formed to be entirely below a bottom surface of a first interconnect layer for the photodetector and are positioned to be electrically coupled and directly in physical contact with a first doped region of the photodetector.
24. The device of clause 23, wherein a second group of said contact plugs for the photodetector are formed to be at least partially above the bottom surface of the first interconnect layer for the transistor and are positioned to be electrically coupled and directly in physical contact with a second doped region of the photodetector, the second doped region having a different polarity than the first doped region.
25. The device of clause 16, wherein said contact plugs for the photodetector's P and N regions are of different materials from different BEOL metal levels.
26. The device of clause 16, wherein said contact plugs for the transistor are made of materials comprise at least one of: tungsten, titanium, or titanium nitride.
27. The device of clause 16, wherein said contact plugs for the photodetector are made of materials comprise interconnect metals including at least one of: copper or aluminum.
28. The device of clause 16, wherein the photodetector includes a P-I-N structure having a highly-doped p-type semiconductor region, a highly-doped n-type semiconductor region, and an intrinsic photosensitive semiconductor region located between said p-type and n-type semiconductor regions,
wherein the intrinsic photosensitive semiconductor region comprises a stack of semiconductor materials including substrate semiconductor material with a first dielectric constant and a photosensitive material with a second dielectric constant, the second dielectric constant higher than the first dielectric constant.
29. The device of clause 28, wherein a thickness ratio between the substrate semiconductor material and other semiconductor materials in the intrinsic photosensitive semiconductor region combined is greater than 1 to 5.
30. The device of clause 16, further comprising:
a select number of dummy fill shapes about a size of the transistor, wherein the dummy fill shapes about the size of the transistor are formed at a same height as the transistor; and
a select number of dummy fill shapes about a size of the photodetector, wherein the dummy fill shapes about the size of the photodetector are formed at the same height as the photodetector.

31. The device of clause 16, wherein a top surface of a light absorption material of the photodetector is higher than a bottom surface of a lowest layer of metal interconnects for the transistor.

32. The device of clause 16, wherein the photodetector includes a light absorption region with a physical structure that has a sidewall misalignment, which is resulted from two or more separate material forming processes growing a substantially same material.

33. The device of clause 16, wherein the photodetector includes a mirror structure for reducing a thickness of a light absorption region of the photodetector.

34. A semiconductor device comprising:
a semiconductor substrate;
a transistor formed on said semiconductor substrate;
a photodetector formed on said semiconductor substrate; and
contact plugs for the photodetector,
wherein at least a portion of said contact plugs for the photodetector is at a same horizontal level as a first interconnect layer for the transistor.

(C) for the multiple absorption layer approach:

1. A method for fabricating a photodetector and a transistor on a same semiconductor substrate, the method comprising:
(1) on a semiconductor substrate, epitaxially growing a first layer of light absorption material of the photodetector over an area where the photodetector is to be formed;
(2) after said growing the first layer of light absorption material, forming at least one layer of metallic contact plugs for the transistor; and
(3) after said forming at least one layer of metallic contact plugs, forming a second layer of light absorption material of the photodetector, wherein the second layer of light absorption material is formed atop the first layer of the light absorption material, such that the two layers of light absorption material, having a substantially same material, form a single light absorption region for the photodetector.

2. The method of clause 1, wherein said epitaxially growing the first layer of light absorption material is performed at a temperature suitable for the photodetector's light absorption material to epitaxially grow on a heterogeneous surface.

3. The method of clause 1, wherein said forming the second layer of light absorption material is performed at a temperature suitable for the photodetector's light absorption material to epitaxially grow on a homogeneous surface.

4. The method of clause 1, wherein said forming the second layer of light absorption material is performed at a temperature lower than said epitaxially growing the first layer of light absorption material.

5. The method of clause 1, wherein said forming the second layer of light absorption material is performed at a temperature lower than a tolerance temperature of the formed metallic contact plugs for the transistor.

6. The method of clause 1, wherein said epitaxially growing the first layer of light absorption material is performed at a temperature higher than a tolerance temperature of the formed metallic contact plugs for the transistor.

7. The method of clause 1, wherein said epitaxially growing the first layer of light absorption material comprises:
performing a surface cleaning process at a temperature higher than a tolerance temperature of the formed metallic contact plugs for the transistor.

8. The method of clause 1, wherein a top surface of the second layer of light absorption material is higher than a bottom surface of a lowest layer of metal interconnects for the transistor.

9. The method of clause 1, wherein said forming the second layer of light absorption material comprises:
removing materials deposited over the photodetector from preceding processes to expose the first layer of light absorption material.

10. The method of clause 9, wherein said forming the second layer of light absorption material further comprises:
epitaxially growing the second layer of light absorption material atop the first layer of light absorption material at least until a height of the single light absorption region is higher than the at least one layer of metallic contact plugs for the transistor.

11. The method of clause 1, wherein the first layer and second layers of light absorption material are formed by using separate lithography processes.

12. The method of clause 11, wherein the separate lithography processes leave a sidewall misalignment on a structure that constitutes the single light absorption region.

13. The method of clause 1, further comprising:
before said forming the second layer of light absorption material within an opening, forming a passivation spacer on a sidewall of the opening to passivate said second layer of light absorption material to reduce device dark-current.

14. The method of clause 1, further comprising:
growing, on the first or second layer of light absorption material, a passivation layer having substrate material; and
directionally etching said passivation layer to form a passivation spacer on said first or second layer of light absorption material.

15. A device comprising:
a semiconductor substrate;
a semiconductor transistor formed on said semiconductor substrate; and
a semiconductor photodetector formed on said semiconductor substrate,
wherein a top surface of a light absorption material of the semiconductor photodetector is higher than a bottom surface of a lowest layer of metal interconnects for the semiconductor transistor.

16. The device of clause 15, further comprising:
a passivation spacer on said first or second layer of light absorption material.

17. The device of clause 15, further comprising a passivation spacer on a sidewall of the semiconductor photodetector, wherein the passivation spacer reduces device dark-current.

18. The device of clause 15, further comprising:
contact plugs for the transistor, wherein the contact plugs for the transistor are made of refractory materials formed during a middle-of-line (MOL) fabrication stage; and
contact plugs for the photodetector, wherein the contact plugs for the photodetector are entirely made of non-refractory materials from metal interconnect layers formed during a back-end-of-line (BEOL) fabrication stage, without any of the refractory materials from said MOL fabrication stage.

19. The device of clause 15, wherein the photodetector includes a P-I-N structure having a highly-doped p-type semiconductor region, a highly-doped n-type semiconductor region, and an intrinsic photosensitive semiconductor region located between said p-type and n-type semiconductor regions,
wherein the intrinsic photosensitive semiconductor region comprises a stack of semiconductor materials including substrate semiconductor material with a first dielectric constant and a photosensitive material with a second dielectric constant, the second dielectric constant higher than the first dielectric constant.

20. The device of clause 19, wherein a thickness ratio between the substrate semiconductor material and other semiconductor materials in the intrinsic photosensitive semiconductor region combined is greater than 1 to 5.

21. The device of clause 15, further comprising:
a select number of dummy fill shapes about a size of the transistor, wherein the dummy fill shapes about the size of the transistor are formed at a same height as the transistor; and
a select number of dummy fill shapes about a size of the photodetector, wherein the dummy fill shapes about the size of the photodetector are formed at the same height as the photodetector.

22. The device of clause 15, wherein the photodetector includes a mirror structure for reducing a thickness of the light absorption region.

23. A device comprising:
a semiconductor substrate;
a semiconductor transistor formed on said semiconductor substrate; and
a semiconductor photodetector formed on said semiconductor substrate,
wherein the semiconductor photodetector includes a light absorption region with a physical structure that has a sidewall misalignment, which is a manifestation of two or more separate material forming processes growing a substantially same material.

24. The device of clause 23, wherein at least one set of metal contact plugs for the transistor or the photodetector is formed between the two or more separate material forming processes.

25. The device of clause 24, wherein at least one of the two or more separate forming processes is performed during or after a middle-of-line (MOL) fabrication stage.

26. The device of clause 23, wherein said substantially same material is a light absorption material for the light absorption region of the semiconductor photodetector.

27. The device of clause 23, wherein said substantially same material includes germanium.

28. The device of clause 23, further comprising:
a passivation spacer on said light absorption region to reduce device dark-current, wherein the passivation spacer material includes amorphous-Si, poly-crystalline Si, nitride, high-k dielectric, silicon dioxide (SiO$_2$), or any combination thereof.

29. The device of clause 23, further comprising:
contact plugs for the transistor, wherein the contact plugs for the transistor are made of refractory materials formed during a middle-of-line (MOL) fabrication stage; and
contact plugs for the photodetector, wherein the contact plugs for the photodetector are entirely made of non-refractory materials from metal interconnect layers formed during a back-end-of-line (BEOL) fabrication stage, without any of the refractory materials from said MOL fabrication stage.

30. The device of clause 23, wherein the photodetector includes a P-I-N structure having a highly-doped p-type semiconductor region, a highly-doped n-type semiconductor region, and an intrinsic photosensitive semiconductor region located between said p-type and n-type semiconductor regions,
wherein the intrinsic photosensitive semiconductor region comprises a stack of semiconductor materials including substrate semiconductor material with a first dielectric constant and a photosensitive material with a second dielectric constant, the second dielectric constant higher than the first dielectric constant., 31. The device of clause 30, wherein a thickness ratio between the substrate semiconductor material and other semiconductor materials in the intrinsic photosensitive semiconductor region combined is greater than 1 to 5.

32. The device of clause 23, further comprising:
a select number of dummy fill shapes about a size of the transistor, wherein the dummy fill shapes about the size of the transistor are formed at a same height as the transistor; and
a select number of dummy fill shapes about a size of the photodetector, wherein the dummy fill shapes ab out the size of the photodetector are formed at the same height as the photodetector.

33. The device of clause 23, wherein the photodetector includes a mirror structure for reducing a thickness of the light absorption region.

What is claimed is:

1. A method for fabricating a photodetector and a transistor on a same semiconductor substrate, the method comprising:
(1) during a front-end-of-line (FEOL) fabrication stage, forming the transistor on a semiconductor substrate;
(2) during a middle-of-line (MOL) fabrication stage and before the photodetector is formed on the semiconductor substrate, forming contact plugs for the transistor by using refractory materials;
(3) forming the photodetector on the semiconductor substrate; and
(4) only during an back-end-of-line (BEOL) fabrication stage, forming contact plugs for the photodetector.

2. The method of claim 1, wherein said contact plugs for the photodetector are formed by using non-refractory materials.

3. The method of claim 1, further comprising:
during said BEOL fabrication stage, forming additional contact plugs on said contact plugs for the transistor, wherein the additional contact plugs for the transistor are to (a) be electrically connected to said formed contact plugs for the transistor and (b) reach a same height as the contact plugs for the photodetector.

4. The method of claim 3, wherein a portion of the additional contact plugs is configured as interconnects that provide inter-device signal transfer for the transistor.

5. The method of claim 1, wherein said forming contact plugs for the photodetector comprises:
in a first step during the BEOL fabrication stage, forming a first set of contact plugs for the photodetector by using a first metal material; and
in a subsequent step during the BEOL fabrication stage, forming a second set of contact plugs for the photodetector by using a second metal material,
wherein the first and second sets of contact plugs are for different doped regions of the photodetector.

6. The method of claim 1, further comprising:
before said forming the transistor, forming a structure having a mesa for the transistor and a mesa for the photodetector; and
adjusting a relative height between the mesa for the photodetector and the mesa for the transistor until a top surface of the mesa for the photodetector is lower than a top surface of the mesa for the transistor.

7. The method of claim 1, wherein said contact plugs for the transistor are the first metal directly contacting the formed transistor, and wherein said contact plugs for the transistor are formed in arrays of pillars or bars.

8. The method of claim 1, wherein said MOL stage further comprises:
depositing a dielectric layer that is the first dielectric layer covering the transistor.

9. The method of claim 1, wherein said contact plugs for the transistor are formed to be entirely below a bottom surface of a first interconnect layer for the transistor and are positioned to be electrically coupled with at least one of: the transistor's gate area, the transistor's source area, or the transistor's drain area.

10. The method of claim 9, wherein a first group of said contact plugs for the photodetector are formed to be entirely below a bottom surface of a first interconnect layer for the photodetector and are positioned to be electrically coupled with a first doped region of the photodetector.

11. The method of claim 10, wherein a second group of said contact plugs for the photodetector are formed to be at least partially above the bottom surface of the first interconnect layer for the transistor and are positioned to be electrically coupled with a second doped region of the photodetector, the second doped region having a different polarity than the first doped region.

12. The method of claim 1, wherein said BEOL stage further comprises: sequentially forming a number of interconnect layers above layers formed during the MOL stage.

13. The method of claim 1, wherein said forming contact plugs for the photodetector comprises:
forming contact plugs for the photodetector's P and N regions by using different BEOL metals during the BEOL stage.

14. The method of claim 1, wherein materials used to form said contact plugs for the transistor comprise at least one of: tungsten, titanium, or titanium nitride.

15. The method of claim 1, wherein materials used to form said contact plugs for the photodetector comprise interconnect metals including at least one of: copper or aluminum.

\* \* \* \* \*